United States Patent
Winters et al.

(10) Patent No.: US 12,461,449 B2
(45) Date of Patent: Nov. 4, 2025

(54) SYSTEMS AND METHODS FOR LITHOGRAPHIC TOOLS WITH INCREASED TOLERANCES

(71) Applicant: ASML NETHERLANDS B.V., Veldhoven (NL)

(72) Inventors: Jasper Winters, Vieuw Vennep (NL); John Erwin Van Zwer, Pijnacker (NL); Johannes Marcus Van Der Lans, Hillegom (NL); Willem Herman Pieter De Jager, Middelbeers (NL); Anton Emiel Van De Ven, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 128 days.

(21) Appl. No.: 18/577,035

(22) PCT Filed: Jun. 17, 2022

(86) PCT No.: PCT/EP2022/066578
§ 371 (c)(1),
(2) Date: Jan. 5, 2024

(87) PCT Pub. No.: WO2023/001458
PCT Pub. Date: Jan. 26, 2023

(65) Prior Publication Data
US 2025/0021012 A1    Jan. 16, 2025

(30) Foreign Application Priority Data
Jul. 20, 2021    (EP) .................................... 21186587

(51) Int. Cl.
*G03F 7/00*    (2006.01)

(52) U.S. Cl.
CPC ...... *G03F 7/70275* (2013.01); *G03F 7/70366* (2013.01); *G03F 7/70475* (2013.01); *G03F 7/70525* (2013.01)

(58) Field of Classification Search
CPC ............. G03F 7/70275; G03F 7/70291; G03F 7/70358; G03F 7/70366; G03F 7/70475; G03F 7/70525
See application file for complete search history.

(56) References Cited

U.S. PATENT DOCUMENTS

| | | | |
|---|---|---|---|
| 6,046,792 | A | 4/2000 | Van Der Werf et al. |
| 7,522,258 | B2 | 4/2009 | Luttikhuis et al. |

(Continued)

FOREIGN PATENT DOCUMENTS

| | | |
|---|---|---|
| WO | 2021155994 | 8/2021 |

OTHER PUBLICATIONS

International Search Report and Written Opinion issued in corresponding PCT Patent Application No. PCT/EP2022/066578, dated Oct. 26, 2022.

*Primary Examiner* — Peter B Kim
(74) *Attorney, Agent, or Firm* — Pillsbury Winthrop Shaw Pittman, LLP

(57) ABSTRACT

A method of use for a lithographic tool includes scanning a substrate relative to a first micro-lens array (MLA) and a second MLA each having rows of lenslets. The first MLA has functional lenslets and extra lenslets and the scanning includes delivering light through the lenslets of the first MLA and second MLA to the substrate. The delivering includes delivering light through the functional lenslets to form a pattern on the substrate, the pattern having gaps caused by a positional or rotational misalignment between the functional lenslets of the first MLA and the second MLA.

(Continued)

The delivering also includes delivering light through the extra lenslets to fill the gaps in the pattern.

20 Claims, 18 Drawing Sheets

(56) References Cited

U.S. PATENT DOCUMENTS

| | | |
|---|---|---|
| 10,928,736 B2 | 2/2021 | De Jager et al. |
| 2006/0098175 A1 | 5/2006 | De Jager et al. |
| 2013/0342820 A1* | 12/2013 | Kajiyama ........... G03F 7/70358 355/67 |

* cited by examiner

901

902

903

1001

1002

1003

SYSTEMS AND METHODS FOR LITHOGRAPHIC TOOLS WITH INCREASED TOLERANCES

CROSS-REFERENCE TO RELATED APPLICATIONS

This application is the U.S. national phase entry of PCT Patent Application No. PCT/EP2022/066578 which was filed on Jun. 17, 2022, which claims priority of European Patent Application No. 21186587.8 which was filed on Jul. 20, 2021, and which is incorporated herein in its entirety by reference.

TECHNICAL FIELD

The description herein relates generally to patterning processes. More particularly, the disclosure includes apparatuses, methods, and computer program products for use of a lithographic tool that increases available tolerances.

BACKGROUND

A lithographic projection apparatus can be used, for example, in the manufacture of integrated circuits (ICs). A pattern corresponding to an individual layer of the IC ("design layout") can be transferred onto a target portion (e.g., comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatuses, the pattern on the entire patterning device is transferred onto one target portion in one go; such an apparatus may also be referred to as a stepper. In an alternative apparatus, a step-and-scan apparatus can cause a projection beam to scan over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices can be found in, for example, U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices, and 2D and/or 3D additive manufacturing.

As semiconductor manufacturing processes continue to advance, the dimensions of functional elements have continually been reduced while the amount of functional elements, such as transistors, per device has been steadily increasing over decades, following a trend referred to as "Moore's law." At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is can be referred to as low-k1 lithography, according to the resolution formula $CD=k_1\times\lambda/NA$, where $\lambda$ is the wavelength of radiation employed (e.g., 248 nm or 193 nm), NA is the numerical aperture of projection optics in the lithographic projection apparatus, CD is the "critical dimension"-generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

Methods, systems, and computer programs for use with a lithographic tool are disclosed. In one aspect, a method includes scanning a substrate relative to a first micro-lens array (MLA) and a second MLA each having rows of lenslets. The first MLA having functional lenslets and extra lenslets. The scanning includes delivering light through the lenslets of the first MLA and second MLA to the substrate. The delivering includes delivering light through the functional lenslets to form a pattern on the substrate, the pattern having gaps caused by a positional or rotational misalignment between the functional lenslets of the first MLA and the second MLA. Light is then delivered through the extra lenslets to fill the gaps in the pattern.

In some variations, a positional misalignment of the first MLA and the second MLA in excess of a tolerance can cause the gaps. The extra lenslets can be in an extra row of the first MLA. A number of extra rows of the extra lenslets can be increased to increase the tolerances proportionally. For example, three extra rows of the MLA can be dedicated to filling the gaps, thereby increasing the tolerance from 10-500 nm to 1-10 um.

In other variations, the scanning can be performed at a second scan angle that can be reduced from a first scan angle due to the utilization of the extra lenslets for filling the gaps. Also, light can be delivered to a stitching region located where a first scan pattern of the first MLA and a second scan pattern of the second MLA overlap. In addition, light can be delivered to an end gap located in an area of the pattern where a first scan pattern of the first MLA and a second scan pattern of the second MLA do not overlap.

In yet other variations, the method can include overscanning during the delivery of the light by continuing the scanning of the substrate in a scan direction to fill the gaps in the pattern, thereby further increasing a tolerance in the scan direction. The gaps can be least partially caused by a positional misalignment of the first MLA and the second MLA, and the scanning performed within a positional tolerance for the positional misalignment increased by the utilization of the extra lenslets. Also, the gaps can be at least partially caused by a rotational misalignment of the first MLA and the second MLA, and the scanning performed within a rotational tolerance for the rotational misalignment increased by the utilization of the extra lenslets.

In some variations, the substrate can be scanned with the tolerances being a combination of a positional tolerance and a rotational tolerance, wherein the scanning is performed within both the positional tolerance and the rotational tolerance that are both increased by utilization of the extra lenslets. For example, approximately half of the increase in the tolerances can be applied to increasing the positional tolerance and approximately half of the increase tolerance can be applied to increasing the rotational tolerance.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

DETAILED DESCRIPTION

As used herein, the term "substrate" describes a material that light can be directed to as part of a manufacturing process. For example, substrate can include a photoresist, wafer, flat panel display, slurry with photo-sensitive material and particles of (e.g., metal or other functional material), etc.

As used herein, the term "patterning process" or "printing" means a process that creates an etched substrate by the application of specified patterns of light as part of a lithography process. A patterning process can also include any process involving the delivery of light in manufacturing, for example in the development of flat screen devices or integrated circuits.

One or more embodiments of a lithographic system and apparatus, a lithographic method, a programmable patterning device and other apparatuses, articles of manufacture and methods are described herein. In an embodiment, a low cost and/or flexible maskless lithographic apparatus is provided. As it is maskless, no conventional mask is needed to expose, for example, ICs or flat panel displays. Similarly, one or more rings are not needed for packaging applications; the programmable patterning device can provide digital edge-processing "rings" for packaging applications to avoid edge projection. Maskless (digital patterning) can also enable patterning on a flexible substrate. As described herein, various embodiments of the disclosed systems and methods allow for increasing the tolerances for alignment/positioning of lens arrays as used in lithographic manufacturing.

Figure 1:
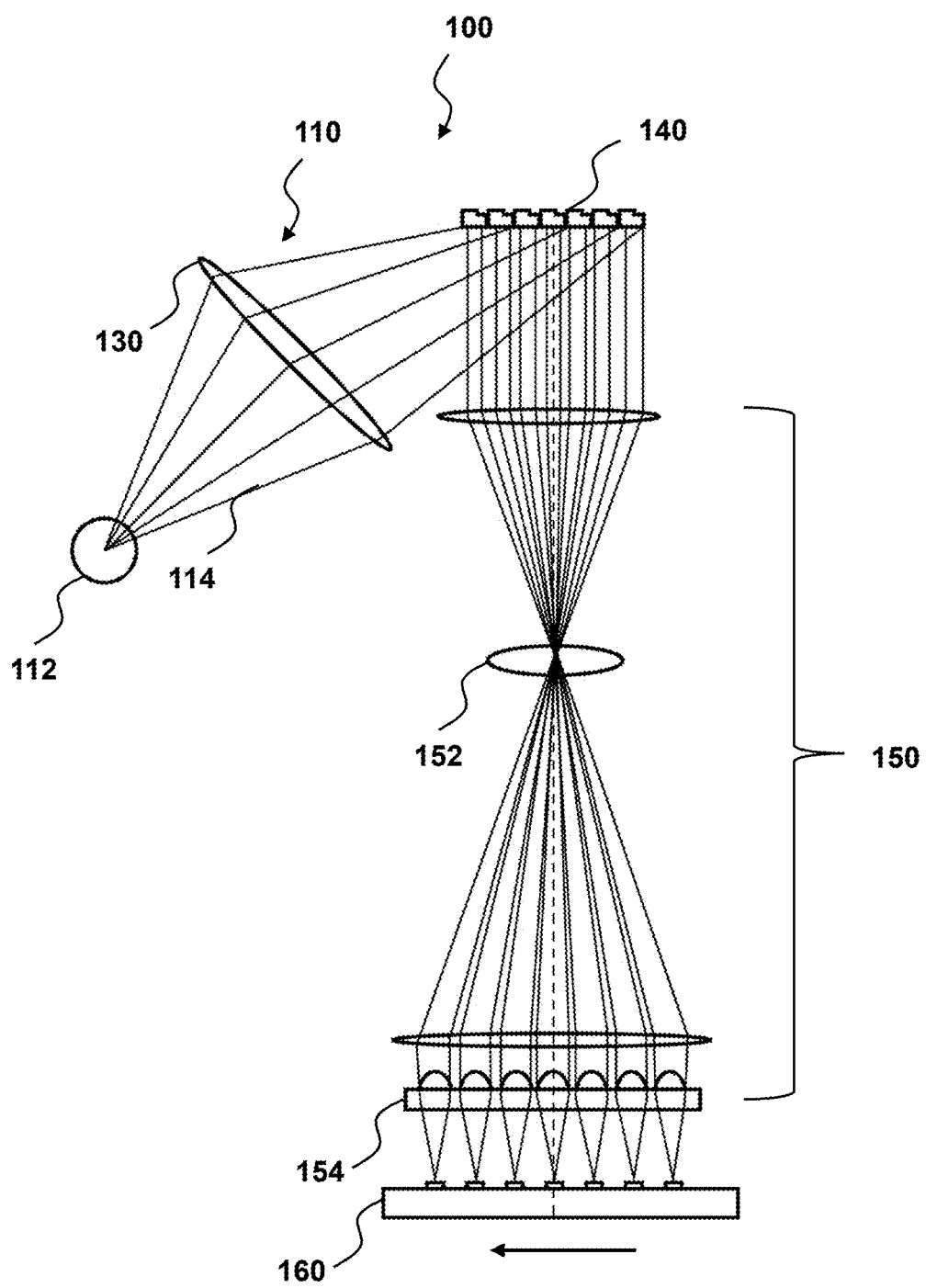
FIG. 1 is a simplified diagram illustrating an exemplary lithography system, according to an embodiment.

FIG. 1 is a simplified diagram illustrating an exemplary lithography system, according to an embodiment. As shown in FIG. 1, lithographic apparatus 100 can include a patterning device 110 and a projection system 150. Patterning device 110 can include light source 112 (such as a laser diode as discussed herein) and a mirror array 140. Mirror array 140 can receive light (also referred to herein as radiation beam or beam 114) from light source 112 and cause beam 114 to laterally displace in the X- and/or Y-directions. In an embodiment, the patterning device 110 may include lens 130 to image the radiation beam 114 from the light source 112 to mirror array 140.

The deflected beam 114 from mirror array 140 can be received by projection system 150. Projection system 150 can include objective lens 152, lens array 154, and any number of other lenses or lens arrays for performing focusing, magnification, aberration correction, etc. Objective lens 152 can be arranged to receive the beam 114 from patterning device 110. In the example of FIG. 1, beam 114 diverges from objective lens 152 and is received by lens array 154, which can include any number of individual lenses. Lens array 154 can then focus beam 114 onto substrate 160. As described further herein, substrate 160 can move relative to lithographic apparatus 100 as illustrated by the arrow.

By controlling the amplitude of light imaged onto specific locations of substrate 160, maskless lithography can be performed, as well as methods incorporating greyscaling (described in further detail below) that provide benefits to the lithography process. Accordingly, in an embodiment, a method of performing lithography can include illuminating mirror array 140 with beam 114. Mirror array 140 can include a number of mirrors that receive the light. The light can be imaged onto substrate 160 to create a pattern.

In an embodiment, there can be a single light source 112 for mirror array 140. In other embodiments, light source 112 can comprise multiple light sources (e.g., 2, 3, 6, 10, etc.) that are combined to provide illumination. In an embodiment, light source 112 can be toggled on and off with a toggle frequency corresponding to an adjustment frequency of mirror array 140. For example, if mirror array 140 is able to change its configuration 30 times a second (e.g., 1/60 second stationary and 1/60 second for adjustment), then light source 112 can be operated to turn on and off such that mirror array 140 is not illuminated during its 1/60 second adjustment period. In another embodiment, one or more laser diodes can act as light source 112 and can be controlled to emit the light, for example at the toggle frequency or pattern, or continuously.

In another embodiment, a lithography system can include multiple light sources (illustrated collectively in FIG. 1 as light source 112) configured to generate light having multiple light amplitudes. The light can then form a pattern at a mirror array configured to direct the light with the pattern to a substrate.

Optionally, the lithographic apparatus can comprise a radiation system (not shown) to supply radiation (e.g., ultraviolet (UV) radiation) to the plurality of light sources 112. If the patterning device is a radiation source itself, e.g. a laser diode array or a LED array, the lithographic apparatus can be designed without a radiation system, i.e. without a radiation source other than the patterning device itself, or at least a simplified radiation system.

The radiation system can include an illumination system (illuminator) configured to receive radiation from a radiation source. The illumination system can include one or more of the following elements: a radiation delivery system (e.g., suitable directing mirrors), a radiation conditioning device (e.g., a beam expander), an adjusting device to set the angular amplitude distribution of the radiation (generally, at least the outer and/or inner radial extent (which can be referred to as σ-outer and σ-inner, respectively) of the amplitude distribution in a pupil plane of the illuminator can be adjusted), an integrator, and/or a condenser. The illumination system can be used to condition the radiation provided to light sources 112 to have a desired uniformity and amplitude distribution in its cross-section. The illumination system can be arranged to divide radiation into sub-beams that can, for example, each be associated with one or more of the plurality of light sources 112. A two-dimensional diffraction grating can, for example, be used to divide the radiation into sub-beams. In the present description, the terms "beam of radiation," "radiation beam," and "beam" encompass, but are not limited to, the situation in which beam 114 is comprised of a plurality of such sub-beams of radiation.

In other embodiments, the radiation system can also include a radiation source (e.g., an excimer laser) to produce the radiation for supply to or by light source 112. The radiation source and the lithographic apparatus 100 can be separate entities, for example when the radiation source is an excimer laser. In such cases, the radiation source is not considered to form part of the lithographic apparatus 100 and the radiation is passed from the source to the illuminator. In other cases, the radiation source can be an integral part of the lithographic apparatus 100, for example when the source is a mercury lamp. Both of these scenarios are contemplated within the scope of the present invention.

In an embodiment, the radiation source, which in an embodiment can be light source 112, can provide radiation having a wavelength of at least 5 nm, e.g. at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In an embodiment, the radiation has a wavelength of at most 450 nm, e.g. at most 425 nm, at most 375 nm, at most 360 nm, at most 325 nm, at most 275 nm, at most 250 nm, at most 225 nm, at most 200 nm, or at most 175 nm. In an embodiment, the radiation can have a wavelength including 436 nm, 405 nm, 365 nm, 355 nm, 248 nm, 193 nm, 157 nm, 126 nm, and/or 13.5 nm. In an embodiment, the radiation can include a wavelength of around 365 nm or around 355 nm. In an embodiment, the radiation can include a broad band of wavelengths, for example encompassing 365 nm, 405 nm and 436 nm. A 355 nm laser source can also be used. In an embodiment, the radiation can have a wavelength of about 405 nm.

In an embodiment, radiation can be directed from the illumination system at the patterning device 110 at an angle between 0 and 90°, e.g. between 5 and 85°, between 15 and 75°, between 25 and 65°, or between 35 and 55°. The radiation from the illumination system can be provided directly to the patterning device 110 (i.e. without relying on mirror array 140). In an alternative embodiment, radiation can be directed from the illumination system to the patterning device 110 by means of a beam splitter configured such that the radiation is initially reflected by the beam splitter and directed to the patterning device 110. The patterning device 110 can modulate beam 114 and reflect it back to the beam splitter which transmits the modulated beam toward the substrate 160. However, alternative arrangements can be used to direct radiation to the patterning device 110 and subsequently to the substrate 160. In particular, an illumination system arrangement may not be required if a transmissive patterning device 110 (e.g. a LCD array) is used or the patterning device 110 is self-emissive (e.g., laser diodes).

Although lithography apparatus 100 according to an embodiment of the invention is herein described as being for exposing a substrate, lithography apparatus 100 can also be used to expose a resist on a substrate or used to project a patterned beam 114 for use in resistless lithography.

To address pixels (or, more generally, locations) on substrate that need to be exposed, mirror array 140 can be provided that directs beam 114 to the desired position. In an embodiment, beam 114 can be directed by mirror array 140 to spots on substrate 160 that need to be exposed. In an embodiment, mirror array 140 can be configured to deflect beam 114 in both X- and Y-directions to position the spot on a pixel on the substrate. When a portion of beam 114 is not needed, it can be deflected towards a beam dump.

As discussed above, mirror array 140 can facilitate deflection of beam 114 from light source 112 in the X- and/or Y-direction. In other words, this type of mirror array 140 can point the beam 114 towards a specific location on lens array 154 and thereby to substrate 160. In an embodiment, mirror array 140 can deflect the radiation in only the Y-direction or only the X-direction. In an embodiment, the mirror array 140 can deflect the radiation in both X- and Y-directions.

In an embodiment, mirror array 140 can be a mechanical (i.e., galvanometer-type), an electro-optic, and/or acousto-optic mirror array. A mechanical mirror array tends to provide the largest number of resolvable radiation spots (i.e., a resolvable spot means that the beam is deflected by an angle equal to its own angular spread) but tends to be slowest in terms of spot scan rate. An electro-optic mirror array tends to be the fastest in terms of spot scan rate but tends to have the smallest number of resolvable radiation spots.

In an embodiment, the mirror array 140 can be an electro-optical mirror array. An electro-optical mirror array can provide a switching speed of up to a few nanoseconds. In an embodiment, the electro-optical mirror array can provide deflection angles of +/−15 degrees. In an embodiment, this can yield about 600 radiation spots for an input beam divergence of 0.05 degrees. In an embodiment, use of an electro-optical mirror array can avoid having a fast moving mechanical part for radiation deflection. In an embodiment, there can be no moving optical elements between the radiation source 112 and the substrate 160.

The electro-optical mirror array can include an optically transparent piezo material. Thus, in an embodiment, beam 114 can be steered due to a potential difference applied over the piezo material. For example, when a potential difference is applied across such an optically transparent material, the index of refraction of the material changes, which changes the direction of beam propagation (i.e., the radiation beam can be deflected). In an embodiment, the material is selected from the following: $LiNbO_3$, $LiTaO_3$, $KH_2PO_4$ (KDP), or $NH_4H_2PO_4$ (ADP). $LiTaO_3$ is transparent at the 405 nm wavelength.

Projection system 150 (e.g., a quartz and/or $CaF_2$ lens system or a catadioptric system comprising lens elements made from such materials, or a mirror system) can be used to project beam 114 onto of substrate 160. Projection system 150 can project a first greyscale pattern provided by light source 112 and mirror array 140 such that the first greyscale pattern is coherently formed on the substrate 160.

In this respect, the projection system can include a focusing element, or a number of focusing elements (herein referred to generically as a mirror array or lens array 154) e.g., a micro-lens array 154 (MLA) or a Fresnel lens array 154, to form the secondary sources and to image spots onto substrate 160.

In an embodiment, the light can be imaged onto a lens array 154 that includes lenses that focus the light onto substrate 160. In another embodiment, substrate 160 can be illuminated multiple times at a location to deliver a total light amplitude.

In an embodiment, lens array 154 (e.g., a MLA) can include at least 10 focusing elements, e.g. at least 100 focusing elements, at least 1,000 focusing elements, at least 10,000 focusing elements, at least 100,000 focusing elements, or at least 1,000,000 focusing elements. In some embodiments, the number of lenses in the lens array 154 can be equal to the number or mirrors in mirror array 140.

In an embodiment, the lens array 154 is movable at least in the direction to and away from substrate, e.g. with the use of one or more actuators. Being able to move the lens array 154 to and away from substrate allows, e.g., for focus adjustment without having to move substrate 160. In an embodiment, individual lens element in the lens array 154, for instance each individual lens element in the lens array 154, are movable at least in the direction to and away from the substrate (e.g., for local focus adjustments on non-flat substrates or to bring each optical column into the same focus distance).

Any of the lenses in lens array 154 can focus light onto a spot on the substrate. As used herein, "spot" means an area on the substrate where the light from one or more lenses reaches substrate 160. The spot can be, but is not necessarily, a focal point of any particular lens. In some embodiments, a spot can correspond to a waist of a Gaussian beam. A spot may be circular, elliptical, or any other shape as a result of the distance, angle, etc. of the substrate and the beam, the shape of any lenses, beam blocks with shaped apertures, etc.

In an embodiment, a spot size can be 10 microns or less, 5 microns or less, e.g., 3 microns or less, 2 microns or less, 1 micron or less, 0.5 micron or less, 0.3 micron or less, or about 0.1 micron. In an embodiment, spot size on the substrate is 0.1 micron or more, 0.2 micron or more, 0.3 micron or more, 0.5 micron or more, 0.7 micron or more, 1 micron or more, 1.5 microns or more, 2 microns or more, or 5 microns or more. In an embodiment, a spot size is about 0.1 micron. In an embodiment, a spot size is about 0.5 micron. In an embodiment, a spot size is about 1 micron.

Such sizes can be applied to a diameter, major or semi-major axis, or other relevant dimension of the spot.

In some embodiments, the lithographic apparatus can include a controller that generates signals to set the patterning device to the requisite state at each stage during the exposure process. The pattern to be formed on the substrate can be provided to the lithographic apparatus in a vector-defined format e.g., GDSII. In order to convert the design information into the control signals, the controller can include one or more data manipulation devices that can be configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (namely a required radiation dose profile across the substrate); converting a required radiation dose map into required radiation amplitude values for each light source; and converting the required radiation amplitude values for each light source into corresponding control signals.

In an embodiment, the control signals can be supplied to the light sources 112 and/or one or more other devices (e.g., a mirror array and/or sensor) by wired or wireless communication. Further, signals from the light sources 112 and/or from one or more other devices (e.g., a mirror array and/or sensor) can be communicated to the controller. In a similar manner to the control signals, power can be supplied to the light sources 112 or one or more other devices (e.g., a mirror array and/or sensor) by wired or wireless means. For example, in a wired embodiment, power can be supplied by one or more lines, whether the same as the ones that carry the signals or different. A sliding contact arrangement can be provided to transmit power. In a wireless embodiment, power can be delivered by RF coupling.

While the previous discussion focused on the control signals supplied to the light sources 112 and/or one or more other devices (e.g., a mirror array and/or a sensor), they should be understood to encompass in addition or alternatively, through appropriate configuration, transmission of signals from the light sources 112 and/or from one or more other devices (e.g., a mirror array and/or sensor) to the controller. So, communication can be one-way (e.g., only to or from the light sources 112 and/or one or more other devices (e.g., a mirror array and/or sensor)) or two-way (i.e., from and to the light sources 112 and/or one or more other devices (e.g., a mirror array and/or sensor)).

In an embodiment, the control signals to provide the pattern can be altered to account for factors that can influence the proper supply and/or realization of the pattern on the substrate. For example, a correction can be applied to the control signals to account for the heating of one or more of the light sources 112, lenses, etc. Such heating can cause changed pointing direction of the light sources 112, lenses, etc., change in uniformity of the radiation, etc. In an embodiment, a measured temperature and/or expansion/contraction associated with light sources 112 and/or other element from, e.g., a sensor can used to alter the control signals that would have been otherwise provided to form the pattern. So, for example, during exposure, the temperature of the light sources 112 can vary, the variance causing a change of the projected pattern that would be provided at a single constant temperature. Accordingly, the control signals can be altered to account for such variance. Similarly, in an embodiment, results from the alignment sensor and/or the level sensor 150 can be used to alter the pattern provided by the light sources 112. The pattern can be altered to correct, for example, distortion, which can arise from, e.g., optics (if any) between the light sources 112 and the substrate 160, irregularities in the positioning of the substrate 160, unevenness of the substrate 160, etc.

With the aid of a positioning device (and optionally a position sensor on a base (e.g., an interferometric measuring device that receives an interferometric beam, a linear encoder or a capacitive sensor)), substrate 160 can be moved accurately, e.g., so as to position different target portions in the path of beam 114. In other embodiments, a positioning device for light sources 112 can be used to accurately correct the position of light sources 112 with respect to the path of beam 114, e.g., during a scan. For example, some embodiments can include a control system that controls a scanning of a substrate relative to the MLA or other components of the optical column described herein (e.g., having any combination of components in FIG. 1). The control system can thus provide two-dimensional horizontal translations of the substrate, a vertical translation, or a rotation of the substrate, in any combination. The control system can also be configured to cause light to be delivered from light source 112 in accordance with any of methods described herein.

Figure 2:
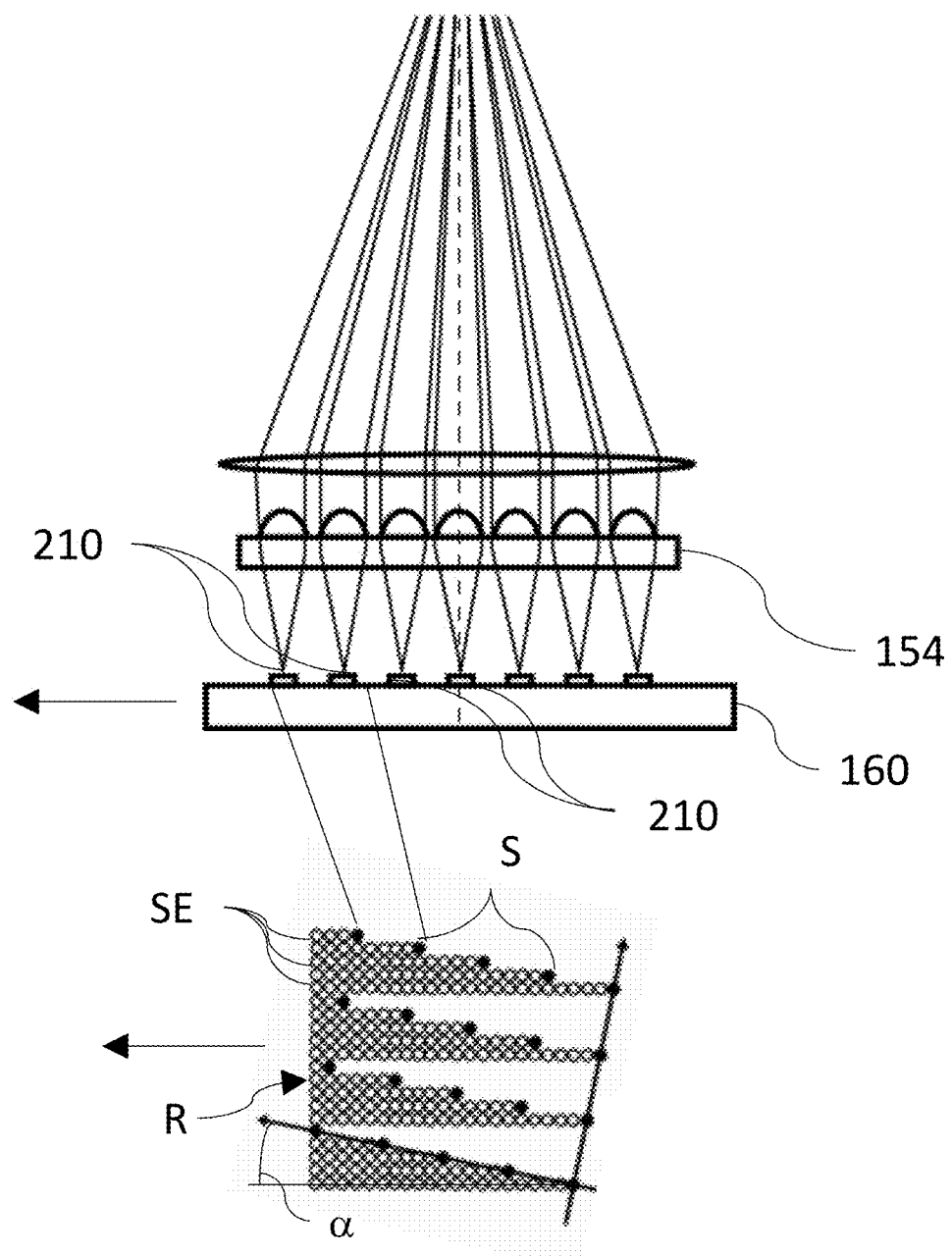
FIG. 2 is a simplified diagram illustrating an exemplary lithography system and method for printing a pattern to a scanned substrate, according to an embodiment.

FIG. 2 is a simplified diagram illustrating an exemplary lithography system and method for printing a pattern to a scanned substrate. In an embodiment, the lithographic apparatus 100 can project the radiation of the light sources 112 onto the substrate in a manner that does not form individual pixels for projection onto the substrate but rather a substantially continuous image for projection onto the substrate. The lithographic apparatus 100, particularly the light sources 112, can be arranged to provide pixel-grid imaging as described in more detail herein. As depicted in the upper diagram of FIG. 2, the spots 210 would appear to have an overlap based on the separation of lenslets in the micro-lens array. However, by scanning the substrate at certain angles, a printed pattern can be created with sufficient overlap of the spot sizes to avoid gaps in printing.

The filled in circles in the lower diagram of FIG. 2 represent the array of spots S (or 310 in the side view) projected onto substrate 160 by lens array 154 in projection system 150. Substrate 160 is moved relative to projection system 150 in the X-direction as a series of exposures are exposed on the substrate. The open circles represent spot exposures SE (or 210 in the side view) that may have previously been exposed on substrate 160. As shown, each spot projected onto substrate 160 by lens array 154 within projection system 150 exposes a row R of spot exposures on substrate 160. The complete pattern for the substrate 160 is generated by the sum of all the rows R of spot exposures SE exposed by each of spots S. Such an arrangement can be referred to as "pixel grid imaging." It will be appreciated that FIG. 2 is a schematic drawing and that spots S can overlap in practice, for example as discussed further herein.

It can be seen that the array of radiation spots S can be arranged at an angle α relative to the substrate scanning direction (the edges of the substrate 160 lie parallel to the X- and Y-directions). This is done so that, when substrate 160 is moved in the scanning direction (the X-direction), each radiation spot will pass over a different area of the substrate, thereby allowing the entire substrate to be covered by the array of radiation spots S. In various embodiments, the angle α can be approximately 80°, 75°, 60°, 45°, 30°, 20°, 10°, 5°, 3°, 1°, 0.5°, 0.25°, 0.10°, 0.05°, or 0.01°. In an embodiment, the angle α is at least 0.0001°, e.g. at least 0.001°. The angle of inclination a and the width of the array in the scanning direction are determined in accordance with the image spot size and array spacing in the direction perpendicular to the scanning direction to ensure the whole surface area of the substrate 160 is addressed. In many of the embodiments discussed further herein, the angle, also referred to as a scan angle, can be approximately 45° due to the exemplary mirror arrays presented.

As used herein, the term "approximately" with regard to the scan angle means that the angle may not be exactly a particular angle but may, in practice, be slightly different due to the geometric details of the system. Accordingly, such numbers are given primarily for illustrative purposes and it should be understood that a person of skill would realize that exact value will vary.

Figure 3:
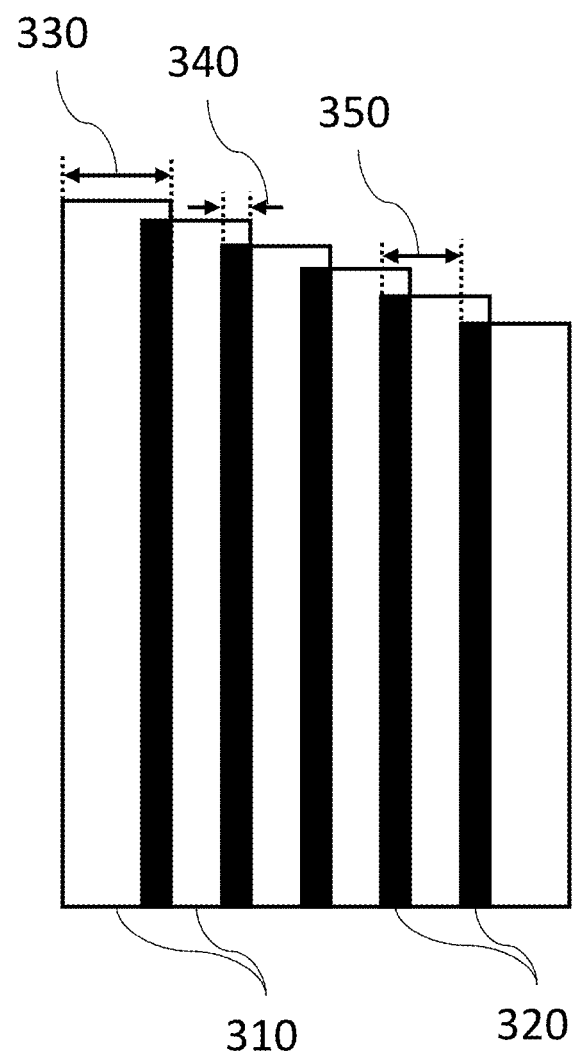
FIG. 3 is a simplified diagram illustrating tolerances provided by an exemplary overlap between tracks printed by a lens array, according to an embodiment.

FIG. 3 is a simplified diagram illustrating tolerances provided by an exemplary overlap between tracks printed by a lens array, according to an embodiment. As described above, focused light that is projected onto the substrate while it is being scanned relative to a lens array (equivalently referred to herein as a micro-lens array or MLA) can trace out a number of "tracks" 310 on the substrate. The tracks can be where light of varying intensities is provided to the substrate for the lithographic process. The lithographic system can be configured to provide an overlap 320 such that the lenslets (individual lenses of an MLA) can deliver light to desired portions of the substrate without having gaps. As used herein, the term "track width" 330 refers to the spot size (e.g., diameter) at the substrate. As seen from FIG. 3, when the printing is done in such a way that there is some overlap between tracks, this width is referred to as "overlap" 340. The term "track pitch" 350 refers to the remaining width of the track (i.e., "track width"–"overlap"). From FIG. 3, it can be seen that the overlap also represents the tolerance between tracks such that there are no spaces or gaps between them. However, due to the very small spot size and other limits of certain high-precision manufacturing processes, the tolerance for deviations in track position or angle of scanning relative to a substate may be problematically small. For example, if a manufacturing process requires the positions of the tracks to be within 100 nm of a target position (i.e., a tolerance of 100 nm) then if the positioning accuracy of the MLA (and hence the tracks) could only be determined within 1000 nm, then impermissible gaps may occur in some places between tracks. Embodiments of the present disclosure address this problem by systems and methods that significantly increases the tolerance of against such misalignments.

Figure 4:
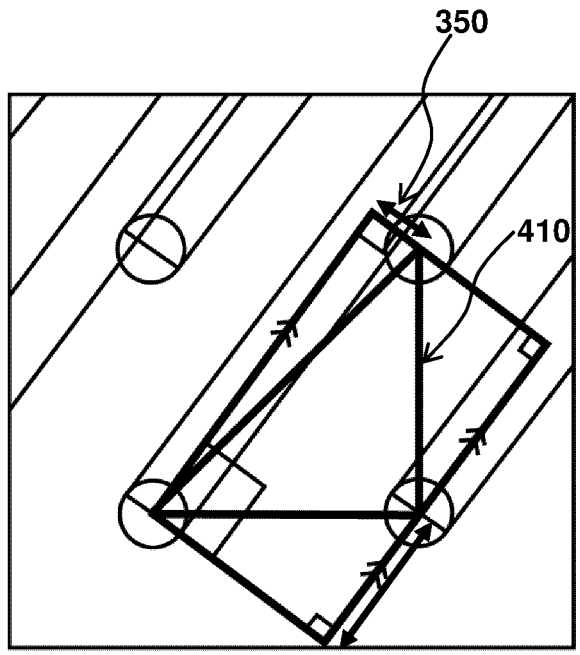
FIG. 4 is a simplified diagram illustrating determination of a pitch and a scan angle, according to an embodiment.
Figure 4:
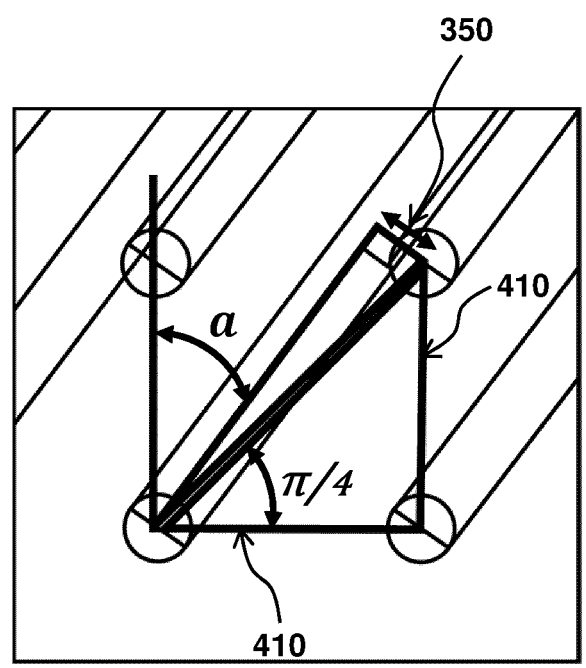

FIG. 4 is a simplified diagram illustrating determination of a pitch and a scan angle, according to an embodiment. The pitch of the MLA, denoted dx and shown in the top panel, can be a function of lenslets in vertical direction $n_y$, trackwidth and overlap, and the desired lenslet against which the first track is placed. In this case, the first track is touching the lenslet of one row up and one column to the right, resulting in close to 45° scan angle. Thus, the optimal pitch 410 is determined by:

$$dx = (trackwidth - \text{overlap})\sqrt{2n_y^2 - 2n_y + 1}. \quad \text{(Eq. 1)}$$

The corresponding scanning angle α, shown in the bottom panel, follows from the optimal pitch, trackwidth and overlap:

$$\alpha = \frac{\pi}{4} - a\sin\left(\frac{trackwidth - \text{overlap}}{dx\sqrt{2}}\right) \quad \text{(Eq. 2)}$$

Figure 5:
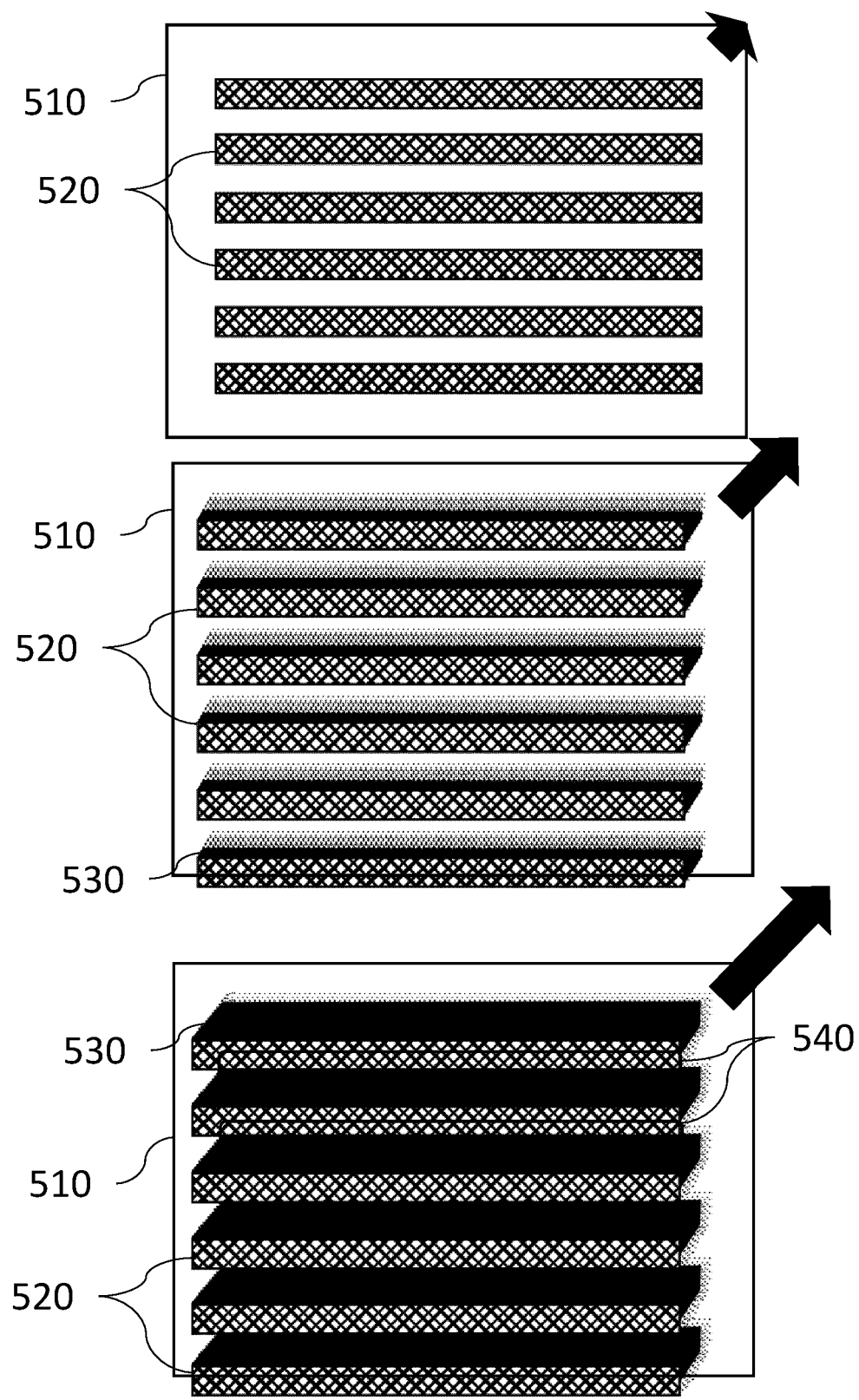
FIG. 5 is a simplified diagram illustrating creation of a pattern at different times during a scanning process, according to an embodiment.

FIG. 5 is a simplified diagram illustrating creation of a pattern at different times during a scanning process, according to an embodiment. To further illustrate an example of how a pattern is formed by the scanning of the substrate relative to the MLA, FIG. 5 shows a scanning process at three points in time.

The top panel illustrates an initial pattern delivered to a substrate 510. The pattern is being shown as delivered by six adjacent MLAs 520. The elongated depiction of the MLAs represents that an MLA may be, for example, a two-dimensional array of 2560×100 lenslets. At the initial time, the pattern is printed directly underneath the lenslets.

In the middle panel, representing some later time, the substrate has scanned up into the right, at approximately a 45° scan angle previously depicted in FIG. 4. As seen, the tracks have begun to form due to the light delivered by the MLAs. At this stage, the tracks printed by adjacent MLA's have not come into contact or generally overlap with each other. Not depicted here, but shown in greater detail in the following figures, the edges of the printed pattern have gaps or spaces where there is simply no following track to fill them in. Such gaps and spaces do not exist in the middle portions of the printed pattern due to the previously described overlap between tracks.

It is understood that specific implementations can vary according to the application of the teachings of the present disclosure, for example, the scan angle need not be at 45°. As seen in the geometry set forth in FIG. 2, the scan angle is a complicated function of the size of the spot at the substrate and any desired degree of overlap. These details are discussed further herein but it should be stressed that no example given need be limiting in its exact design. For example, scan angles can be approximately 0°, 10°, 20°, 30°, 45°, 60°, 80°, or 90°. Variation around a particular specified scan angle can be based on permissible angular tolerances, for example, variations of 1 to 5 microradians (μrad), 6 to 10 μrad, or less than 20 μrad.

In the bottom panel, the substrate has scanned even further, to the point where the tracks due to adjacent MLAs meet, and even overlap to an extent. Thus, the printing process results in a pattern that is substantially filled with the desired light delivered to the substrate but which includes (again not depicted in FIG. 5) regions around the edges that may include gaps in coverage. Again, rather than the scanning stopping when the next MLA reaches the first part of the track printed by the adjacent MLA, to obtain full coverage, the tracks are somewhat interwoven. This "stitching region" 540 is described further herein, with particular reference to FIGS. 7 and 8.

Figure 6:
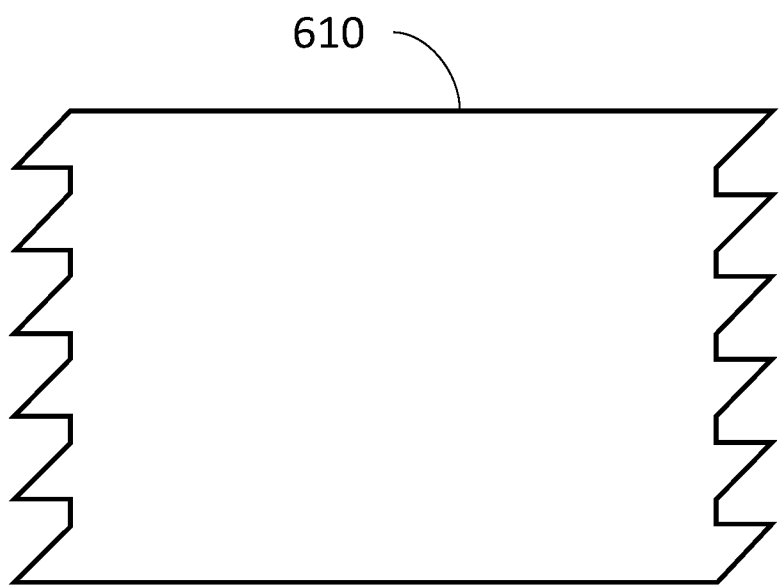
FIG. 6 is a simplified diagram illustrating a completed scanning pattern, according to an embodiment.

FIG. 6 is a simplified diagram illustrating a completed scanning pattern 610, according to an embodiment. The exemplary pattern shown in FIG. 6 depicts an area of full scan coverage. This pattern can also be referred to in certain embodiments as a "tile," as certain lithographic processes may provide for the printing of multiple tiles by numerous similar groups of MLAs. The pattern outline has a slightly different shape than the one apparent from what was shown in FIG. 5. Again, this is because this completed pattern depicts only the region where there were no gaps between tracks.

The edges of pattern 610 have what is referred to herein as sawtooth-shaped regions. These regions are a natural consequence of the printing method previously discussed. The exact shape of the sawtooth shaped regions will vary depending on the particular MLA geometry and system setup. For example, if MLAs of different array sizes are used, or a different scan angle is used, or the separation between MLAs varies, these can all affect the details of the printed pattern.

Figure 7:
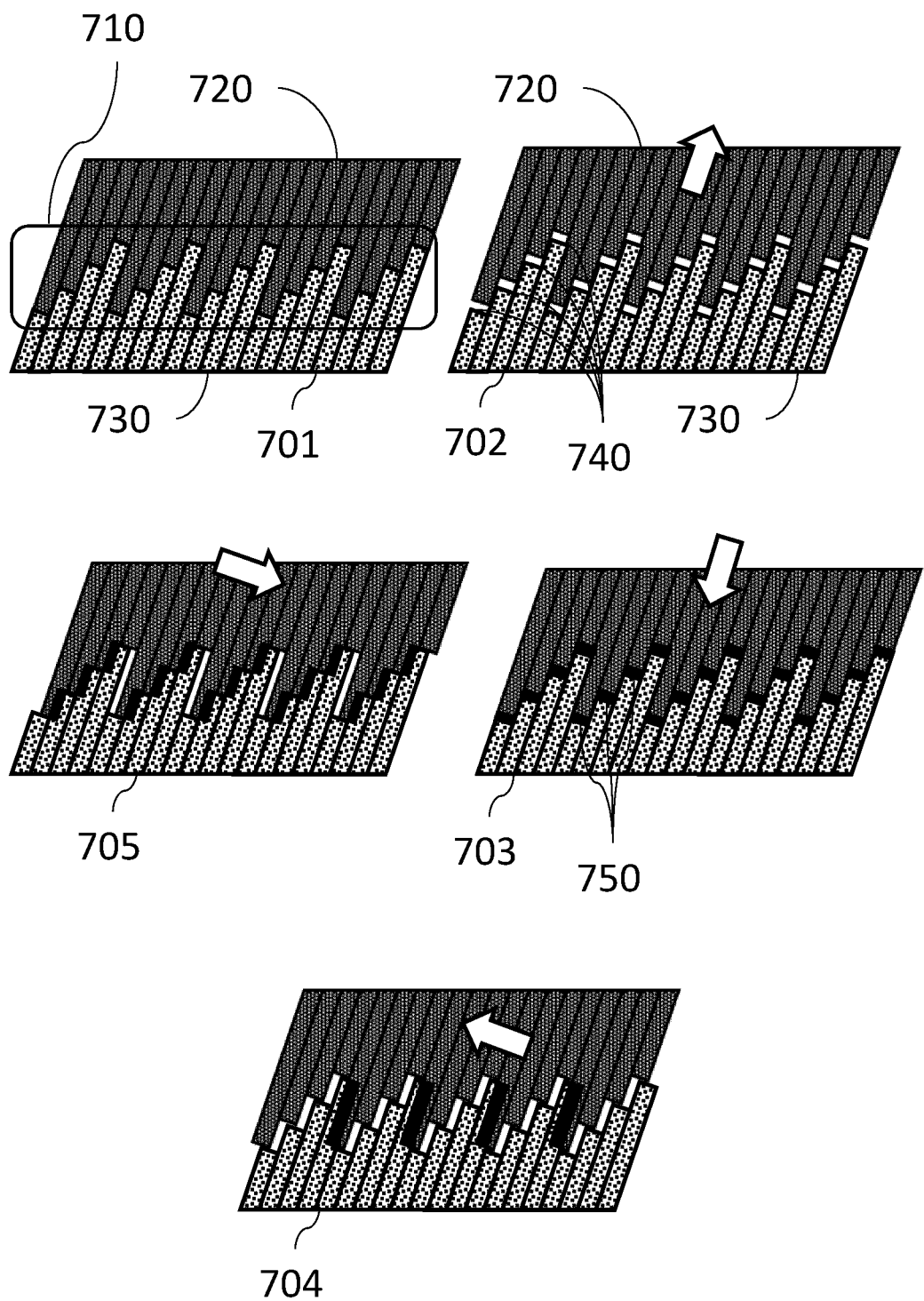
FIG. 7 is a simplified diagram illustrating the effects of various types of misalignments on tracks printed a stitching region for adjacent MLAs, according to an embodiment.

FIG. 7 is a simplified diagram illustrating the effects of various types of misalignments on tracks printed a stitching region for adjacent MLAs, according to an embodiment. The top left panel 701 depicts a simplified representation of a stitching region 710 (similar to stitching region 540) in a pattern delivered by a first MLA 720 and a second MLA 730 in the idealized case where there is no misalignment. It can be seen that where the tracks of one MLA ends that the other begins. The top right 702 and middle right 703 panels depict the effects of displacements in the direction of the track (i.e., the scanning direction). In the top right panel, MLA 720 has a slight upward displacement that results in the shown gaps 740. In some embodiments, the system can utilize overscanning with either of the MLAs to fill in the gap. Similarly, the middle right panel shows the top MLA having a slight downward displacement resulting in some additional overlap 750. Here, this can be compensated for by shortening one of the scans.

The middle left 705 and lower 704 panels depict the effects of a lateral displacement (i.e., perpendicular to the scanning direction). The lower panel shows a leftward displacement that results in small gaps between the tracks of the two MLAs. In certain embodiments, this can be compensated for by again extending the scan although it can be seen that the increased longitudinal extent compared to the small gaps depicted in the upper right panel 702 will require a longer scan time for compensation. Accordingly, in such cases this can reduce the throughput of the overall printing process by up to several percent. In the fields of manufacturing, such losses of throughput can be quite expensive and serious. The middle left panel 705 shows the most serious case where there is a rightward displacement. Here, because the displacements very long as a result of the printing pattern, to compensate for the depicted gaps would require even more additional scanning, a significant cost to printing throughput. Accordingly, certain embodiments as described further herein provide a solution to this problem by provided sufficient overlap such that the tolerance for misalignment can be greatly increased with only a minor impact on manufacturing throughput.

As used herein, terms such as "lateral," "right," "left," etc. are not intended to limit the scope of the disclosure to any particular embodiment or orientation relative to an arbitrary system. These directions are intended for explanatory purposes only and thus their technical equivalents should be recognized to be within the scope of the present disclosure.

Similarly, the improved tolerances can thus be in any direction consistent with the teachings of the present disclosure without reference to an absolute coordinate system or particular hardware setup. For example, when describing improving tolerance across a scan direction, is contemplated that a different set up or implementation of the printed pattern could result in the directions being reversed (e.g., reversing "left" and "right" displacements). Also, it is generally irrelevant which micro lens array is considered to be positioned correctly and which is considered to be displaced or rotated relative to the other.

Figure 8:
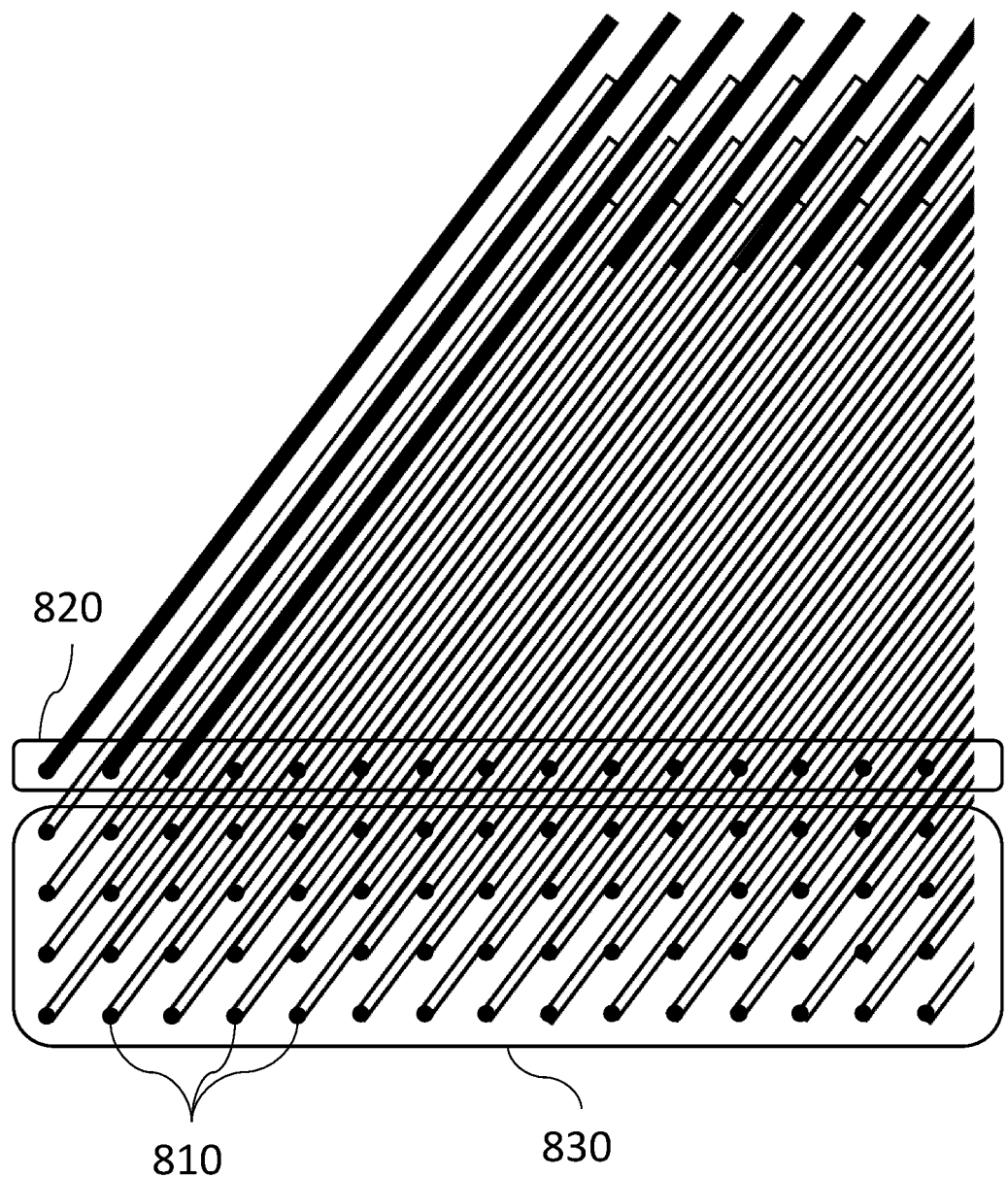
FIG. 8 is a simplified diagram illustrating utilizing extra lenslets in a lens array to fill in gaps in a scanning pattern, according to an embodiment.

FIG. 8 is a simplified diagram illustrating utilizing extra lenslets in a lens array to fill in gaps in a scanning pattern, according to an embodiment. FIG. 8 shows a portion of a printed pattern delivered by a single MLA. For explanatory purposes, the position of lenslets 810 in the MLA is shown by the circles in the bottom portion of the figure. The MLA, in this example, has only 5 rows, rather than the typical 100 or more in an actual MLA. As explained further below, in this simplified example, the top row of lenslets shown by the circled region, are referred to as "extra" lenslets 820. The other four rows are referred to as "functional" lenslets 830. The tracks are shown by the angled rectangles, with the tracks printed by the functional lenslets being open and the tracks printed by the extra lenslets being filled in. The tracks shown filled in at the top act to fill in the gaps caused by severe misalignments, for example, of the type shown in panel 705 in FIG. 7.

Disclosed herein are systems and methods for use of a lithographic tool (e.g., an MLA and associated systems) that results in an improved tolerance against misalignments. As previously discussed, the disclosed methods can include scanning a substrate relative to a first micro-lens array (MLA) and a second MLA each having of rows of lenslets, with the scanning comprises delivering light through the lenslets of the first MLA and second MLA to the substrate. However, to address the previously-described problem of improving tolerances against misalignments, the first MLA, depicted as in the example of FIG. 8, can have functional lenslets 810 and extra lenslets 820. By delivering light through the extra lenslets to fill the gaps in the pattern, such gaps being caused from a misalignment being too great, the filling in of those gaps by the extra lenslets effectively increases the tolerance of the system. Equivalently, the delivery of light by the extra lenslets can be programmed to occur only when there would be a gap, thus avoiding the presence of gaps at the outset. Various implementations can thus significantly increase the tolerance for misalignments (e.g., making a system with a formerly ±50 nm tolerance to now have an approximately ±1000 nm tolerance).

As the gaps appear between misaligned MLAs, some embodiments of the disclosed methods can include delivering light to a stitching region located where a scan pattern of the MLA and an adjacent scan pattern of the adjacent MLA scan patterns overlap. By comparing the generally open area at the bottom of the depicted pattern with the area at the top of the depicted pattern, it can be seen that the extra lenslets filled in a significant portion of the gaps thereby increasing the tolerance for misalignments before gaps appear in the stitching region.

In summary, a positional and/or rotational misalignment of adjacent MLAs in excess of the tolerance can cause gaps between tracks. To address this problem, a number of the extra rows (and their lenslets) can be utilized to fill in gaps, thereby increasing the tolerance proportionally. While the particular tolerances and their corresponding increases are very application-specific, in one embodiment, the disclosed systems and methods can include three extra rows of the MLA dedicated to filling the gaps, thereby increasing the tolerance from 10-500 nm to the second tolerance of 1-10 um. In one specific example, the tolerance can increase from 50 nm to 950 nm. Thus, in general, the tolerance can be increased by an amount proportional to half of the track width (e.g., ±50 nm to ±(50+Nx300) nm, where N is the number of extra rows having the extra lenslets). In some implementations, other numbers of extra rows can be utilized. For example, one, two, five, 10, 20, etc. to meet a desired level of increase in tolerance of the system. Furthermore, not every lenslet in the extra rows need be used as an extra lenslet for printing. For example, is contemplated that due to the ability of the DMD to provide light to a particular lenslet at a given point in time, such can be controlled to only activate needed lenslets. The utilized lenslets can thus include for example, any combination of extra lenslets in stitching regions on any side of the pattern printed by a given MLA.

Some embodiments can include delivering light to an end gap. One example of an "end gap" can be seen in FIG. 8 as the leftmost region, which in the current example is located in an area where a scan pattern of the MLA and an adjacent scan pattern of the adjacent MLA (e.g., an MLA above or below the current MLA) do not overlap. For the three leftmost tracks, it can be seen that they are filling in missed gaps in coverage. This has the effect of increasing the actual printing area and thereby also increasing the tolerance for misalignments before an unacceptable gap would appear.

Figure 9:
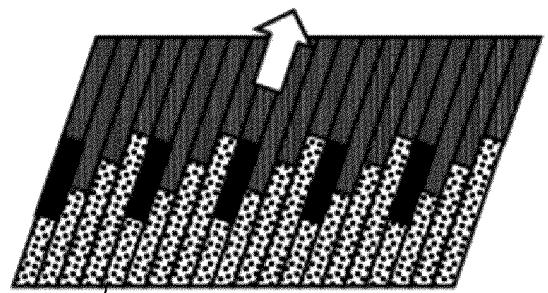
FIG. 9 is a simplified diagram depicting an example of the increase in tolerance due to utilization of the extra lenslets, according to an embodiment.
Figure 9:
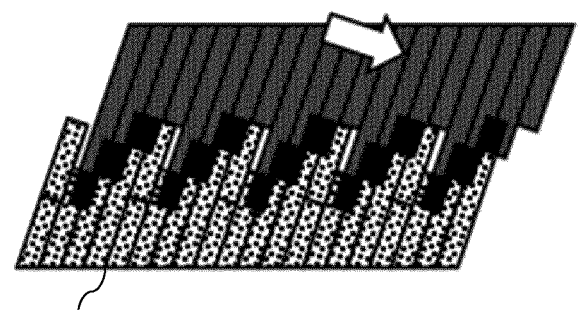
Figure 9:
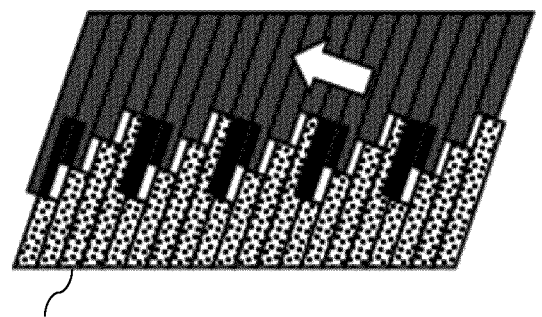

FIG. 9 is a simplified diagram depicting an example of the increase in tolerance due to utilization of the extra lenslets, according to an embodiment. The diagrams in FIG. 9 illustrate that though the extra lenslets themselves can increase the available overlap and thus the tolerance, when relying on only extra lenslets this is only true for displacements. Thus, while the extra lenslets themselves do provide some benefit, and thus still address the technical problems set forth herein, other implementations having additional features (e.g., overscanning) can provide further benefits and are discussed further herein. For the simplified example of using only extra lenslets to improve tolerances, as shown in the top panel 901, there is no effective change to the tolerance for displacements in the scan direction because not every track has the extra row available to filling gaps.

However, as previously described, the extra rows can write the first missing track on the left side. This increases the domain width by $n_y-1$ tracks. As shown in panels 902 and 903, the extra lenslets can increase the tolerance in a lateral direction to a scan direction. The middle panel 902 illustrates that for a lateral rightward displacement the extent of the gaps is significantly reduced. In this example, by increasing the overlap in the lateral direction by the track pitch (e.g., 600 nm) the tolerance is increased by 600 nm, or ±300 nm. The bottom panel 903 illustrates that for a leftward displacement while one gap has been removed due to the increased overlap, two other gaps remain and thus the tolerance of the system to this sort of displacement remains unchanged.

Also, due to the reduced number of functional tracks (the total number of rows is assumed fixed, e.g., at 100), the additional rows having the extra lenslets effectively reduce the number of functional rows. Accordingly, the pitch utilized for performing the scanning at the second scan angle is reduced from a first scan angle due to the utilization of the extra lenslets for filling the gaps.

Figure 10:
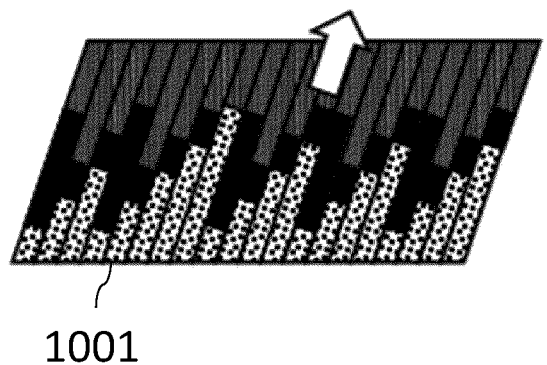
FIG. 10 is a simplified diagram depicting examples of the increase in tolerance due to utilization of extra lenslets and overscanning, according to an embodiment.
Figure 10:
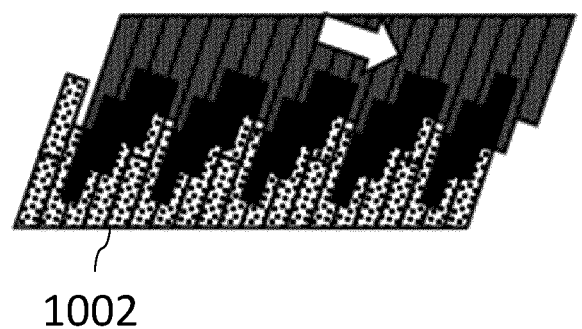
Figure 10:
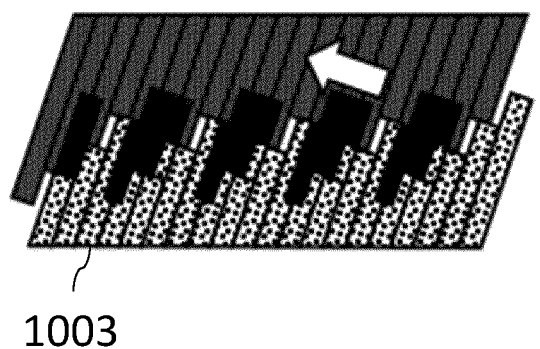

FIG. 10 is a simplified diagram depicting examples of the increase in tolerance due to utilization of extra lenslets and overscanning, according to an embodiment. In some embodiments, the disclosed methods can include overscanning during the delivery of the light by continuing the scanning of the substrate in a scan direction to at least partially fill the gaps in the pattern, thereby further increasing the tolerance in the scan direction. The top panel 1001 illustrates the increase in overlap and corresponding increase in tolerance for displacements in the scan direction. The middle panel 1002 illustrates the increase in overlap for rightward displacements. This arrangement maintains the improved tolerance described previously for rightward displacements. However, the bottom panel 1003 illustrates a synergistic result achieved when combining the extra lenslets with overscanning. Here, due to the additional rows providing coverage of a number of gaps, the tolerance for leftward is increased in the same manner as for rightward displacements. As such, it can be seen that the combination of these disclosed methods provides a robust increase in tolerance for displacements in any direction. Recall that in one example given herein that overscanning alone (panel 901) only increases the tolerance in the scan direction, thus the tolerance against lateral displacements remained 100 nm. Similarly, the extra lenslets alone (panel 903) did not cover all gaps, thereby keeping the tolerance also at 100 nm. Thus, the synergistic effect is evidenced by the increase in the tolerance that is based on the track width and proportional to the number of extra rows used with the disclosed method. Accordingly, in this example, utilizing three extra rows and overscanning, provides an increase of ±300 nm×3=±900 nm additional tolerance. Thus, the tolerance is increased by a factor of 10, with only a very slight change in throughput due to the change in scan angle.

Figure 11:
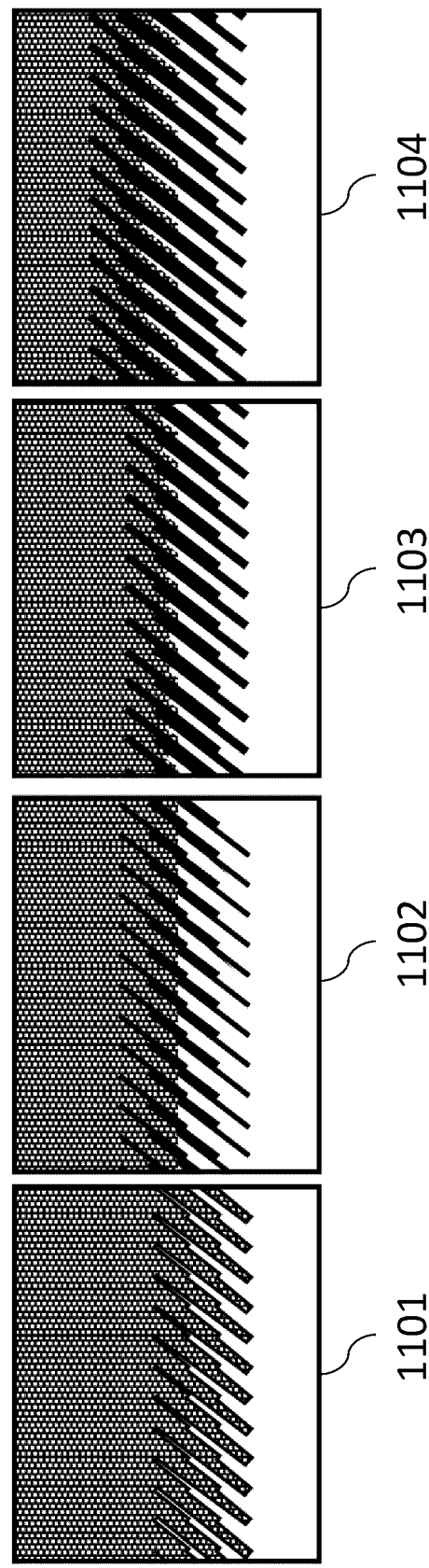
FIG. 11 is a simplified diagram depicting an example of increased overlap of adjacent lens arrays, according to various embodiments.

FIG. 11 is a simplified diagram depicting an example of increased overlap of adjacent lens arrays, according to various embodiments. The above concepts are restated and depicted slightly differently in FIG. 11 by the four panels showing the different changes in overlap. Panel 1101 illustrates the available overlap to cover gaps. Panel 1102 illustrates the effect of performing one pitch overscanning (i.e., continuing a scan sufficient to cover a gap caused by one pitch of the pattern). Here, it can be seen that more overlap is available to cover gaps. Panel 1103 illustrates the effect of using one extra row (without overscanning). Again, more overlap is available for covering gaps. Panel 1104 shows an example where the one pitch overscanning and one extra row are combined to increase the overlap. Here, for the exemplary displacement (±350 nm), no gaps are shown and thus the tolerance of the system is greatly improved.

Figure 12:
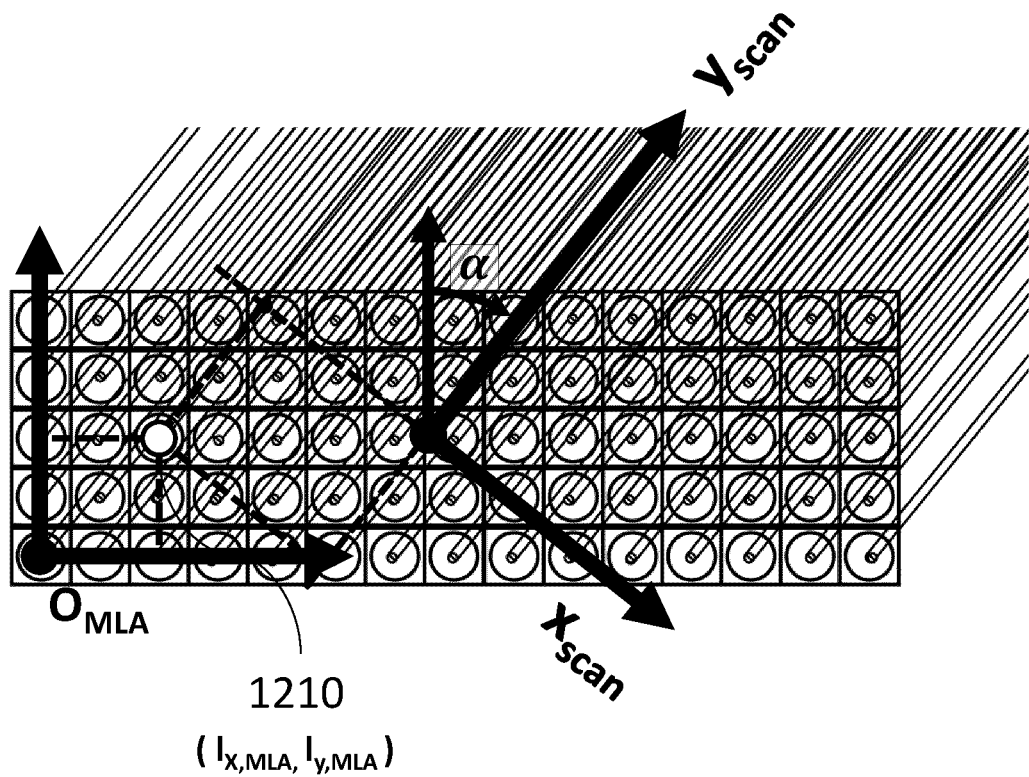
FIG. 12 depicts an exemplary MLA that is not rotated but has an exemplary axis of rotation at the center of the MLA, according to an embodiment.
Figure 13:
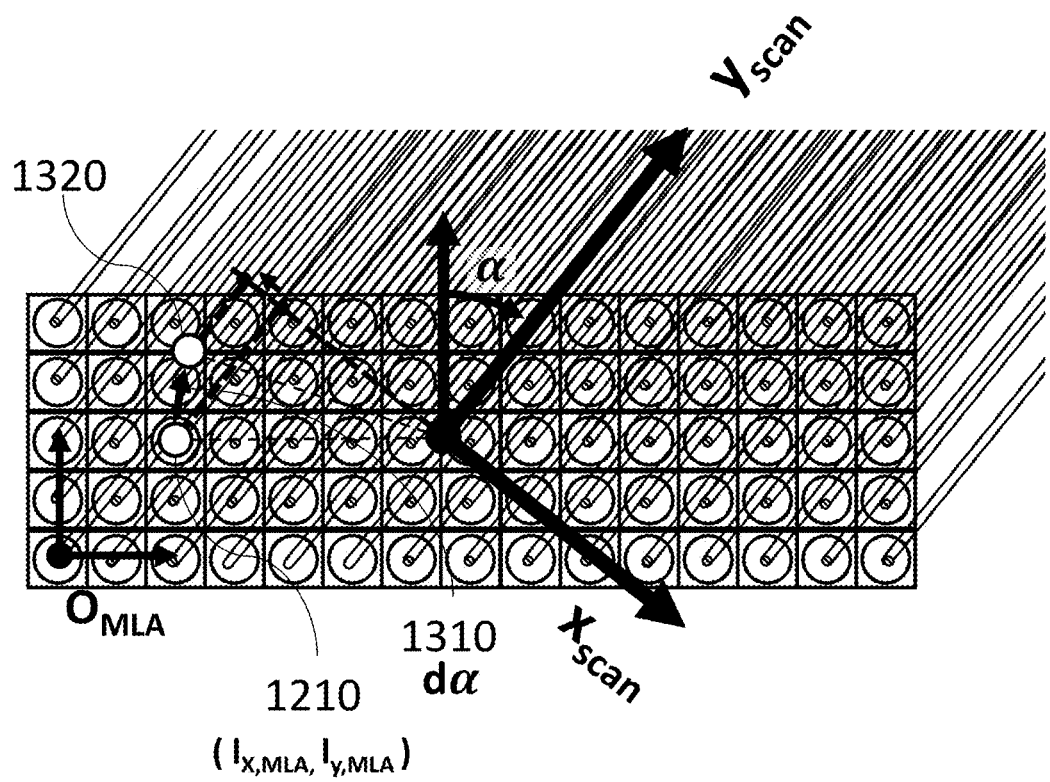
FIG. 13 depicts the same MLA but rotated by an angle δα, according to an embodiment.

FIG. 12 depicts an exemplary MLA that is not rotated but has an exemplary axis of rotation at the center of the MLA, according to an embodiment. FIG. 13 depicts the same MLA but rotated by an angle δα 1310, according to an embodiment. Improving tolerance against positional misalignments (i.e., linear) has previously been discussed. However, the disclosed methods can also similarly improve the tolerance against rotational misalignments that may occur when adjacent MLAs are rotated with respect to each other. This can be understood by realizing that a rotated MLA results in an effective translation (e.g., in X and Y) of a given lenslet, depending on its distance from the axis of rotation. Thus, by improving the tolerance against translations as described herein, this can effectively provide a tolerance against rotational misalignments as well.

The problematic across-track displacements can be caused by rotation of the MLA. One example being a displacement along the $x_{scan}$ axis as shown. In the following example, the lenslets can be defined in the MLA coordinate system and have coordinates: pitch. $(l_x, l_y)$, where $l_x$ and $l_y$ are the index (element 1220) of the lenslets counting from zero from the bottom left of the MLA. This can be converted to the scan coordinate system using homogeneous coordinates as follows:

$$l_{scan} = M_{scan}^{-1} l_{MLA}, \qquad (Eq.\ 3)$$

$$l_{MLA} = \begin{bmatrix} pitch \cdot l_x & pitch \cdot l_y & 1 \end{bmatrix}^T, \qquad (Eq.\ 4)$$

$$M_{scan} = \begin{bmatrix} \cos(\alpha) & \sin(\alpha) & O_{scan_x} \\ -\sin(\alpha) & \cos(\alpha) & O_{scan_y} \\ 0 & 0 & 1 \end{bmatrix}, \qquad (Eq.\ 5)$$

and

-continued $$M_{scan}^{-1} = \begin{bmatrix} \cos(\alpha) & -\sin(\alpha) & -O_{scan_x}\cos(\alpha) + O_{scan_y}\sin(\alpha) \\ \sin(\alpha) & \cos(\alpha) & -O_{scan_x}\sin(\alpha) - O_{scan_y}\cos(\alpha) \\ 0 & 0 & 1 \end{bmatrix}. \quad \text{(Eq. 6)}$$

If the MLA is rotated da with respect to the scan direction, so that the lenslet is at the position shown by element 1320, the position of the track scanned by lenslet $I_{MLA}$ changes by:

$$l'_{scan} = M_{rot}M_{scan}^{-1}l_{MLA}, \quad \text{(Eq. 7)}$$

The displacement in the scan coordinate system is then:

$$l'_{scan} - l_{scan} = (M_{rot} - I)M_{scan}^{-1}l_{MLA}, \text{ and} \quad \text{(Eq. 8)}$$

We are interested in the maximum displacement $d_{max}$ along the $x_{scan}$ direction:

$$d_{max} = l'_{x,scan} - l_{x,scan}. \quad \text{(Eq. 9)}$$

Filling in the matrix multiplications gives:

$$l'_{x,scan} - l_{x,scan} = (l_{x,scan} - 1)\cos(\delta\alpha) + l_{y,scan}\sin(\delta\alpha) \quad \text{(Eq. 10)}$$

and $$d_{max} = (1_{x,scan} - 1)\cos(\delta\alpha) + l_{y,scan}\sin(\delta\alpha). \quad \text{(Eq. 11)}$$

Solving for $\delta\alpha$ gives the angular tolerance for a given maximum displacement of the scan track perpendicular to the scan direction:

$$\delta\alpha = 2\,a\tan\left(\frac{c_2 \pm \sqrt{C_2^2 - d_{max}(2C_1 + d_{max})}}{2C_1 + d_{max}}\right) \quad \text{(Eq. 12)}$$

with $C_1 = I_{x,scan}$ and $C_2 = l_{y,scan}$. With a scan direction close to 45°, the tolerance is maximized mostly when $C_2 = L_{y,scan}$ is maximized. That is, the lenslet with the largest $y_{scan}$ coordinate will have the largest displacement. In this configuration, this will be either the bottom left ($I_{MLA}=(0,0)$) or the top right ($I_{MLA}=\text{pitch}\cdot(n_x, n_y)$) lenslet. In this way, the coordinates of these lenslets can determine the angular tolerance. Thus, as seen above, in some embodiments, gaps may be at least partially caused by a rotational misalignment of adjacent MLAs. As described with the prior solutions, the tolerance for the rotational misalignment can be increased by the utilization of the extra lenslets.

In some implementations, both types of misalignments can be present. Thus, in embodiments that include scanning the substrate with the tolerance being a combination of a positional tolerance and a rotational tolerance, the utilization of the extra lenslets increases both the positional tolerance and the rotational tolerance. In some embodiments, it may be desirable to balance the improved tolerance provided by the disclosed methods between positional tolerance and rotational tolerance.

Accordingly, such embodiments may have approximately half of the increase tolerance applied to increasing the positional tolerance and approximately half of the increase tolerance applied to increasing the rotational tolerance. However, it is understood that any desired allocation for improving the tolerance due to linear displacements and rotations is contemplated by the present disclosure.

Figure 14:
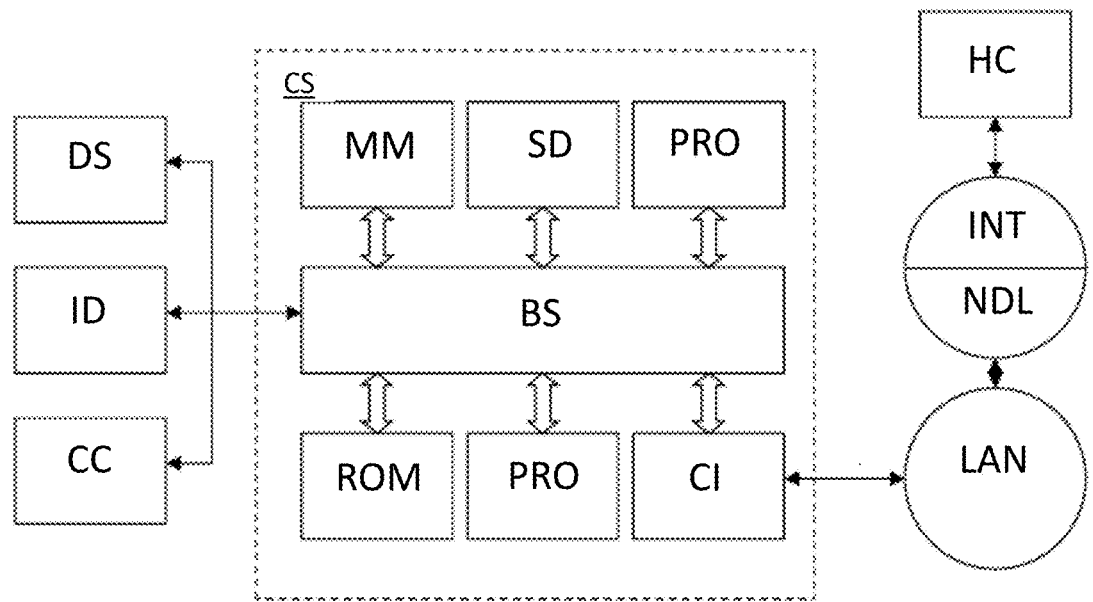
FIG. 14 is a block diagram of an example computer system, according to an embodiment.

FIG. 14 is a block diagram of an example computer system CS, according to an embodiment.

Computer system CS includes a bus BS or other communication mechanism for communicating information, and a processor PRO (or multiple processors) coupled with bus BS for processing information. Computer system CS also includes a main memory MM, such as a random access memory (RAM) or other dynamic storage device, coupled to bus BS for storing information and instructions to be executed by processor PRO. Main memory MM also may be used for storing temporary variables or other intermediate information during execution of instructions to be executed by processor PRO. Computer system CS further includes a read only memory (ROM) ROM or other static storage device coupled to bus BS for storing static information and instructions for processor PRO. A storage device SD, such as a magnetic disk or optical disk, is provided and coupled to bus BS for storing information and instructions.

Computer system CS may be coupled via bus BS to a display DS, such as a cathode ray tube (CRT) or flat panel or touch panel display for displaying information to a computer user. An input device ID, including alphanumeric and other keys, is coupled to bus BS for communicating information and command selections to processor PRO. Another type of user input device is cursor control CC, such as a mouse, a trackball, or cursor direction keys for communicating direction information and command selections to processor PRO and for controlling cursor movement on display DS. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system CS in response to processor PRO executing one or more sequences of one or more instructions contained in main memory MM. Such instructions may be read into main memory MM from another computer-readable medium, such as storage device SD. Execution of the sequences of instructions contained in main memory MM causes processor PRO to perform the process steps described herein. One or more processors in a multi-processing arrangement may also be employed to execute the sequences of instructions contained in main memory MM. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor PRO for execution. Such a medium may take many forms, including but not limited to, non-volatile media, volatile media, and transmission media. Non-volatile media include, for example, optical or magnetic disks, such as storage device SD. Volatile media include dynamic memory, such as main memory MM. Transmission media include coaxial cables, copper wire and fiber optics, including the wires that comprise bus BS. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. Non-transitory computer readable media can have instructions recorded thereon. The instructions, when executed by a computer, can implement any of the features described herein. Transitory computer-readable media can include a carrier wave or other propagating electromagnetic signal.

Various forms of computer readable media may be involved in carrying one or more sequences of one or more instructions to processor PRO for execution. For example, the instructions may initially be borne on a magnetic disk of a remote computer. The remote computer can load the instructions into its dynamic memory and send the instructions over a telephone line using a modem. A modem local to computer system CS can receive the data on the telephone line and use an infrared transmitter to convert the data to an infrared signal. An infrared detector coupled to bus BS can receive the data carried in the infrared signal and place the data on bus BS. Bus BS carries the data to main memory MM, from which processor PRO retrieves and executes the instructions. The instructions received by main memory MM may optionally be stored on storage device SD either before or after execution by processor PRO.

Computer system CS may also include a communication interface CI coupled to bus BS. Communication interface CI provides a two-way data communication coupling to a network link NDL that is connected to a local network LAN. For example, communication interface CI may be an integrated services digital network (ISDN) card or a modem to provide a data communication connection to a corresponding type of telephone line. As another example, communication interface CI may be a local area network (LAN) card to provide a data communication connection to a compatible LAN. Wireless links may also be implemented. In any such implementation, communication interface CI sends and receives electrical, electromagnetic or optical signals that carry digital data streams representing various types of information.

Network link NDL typically provides data communication through one or more networks to other data devices. For example, network link NDL may provide a connection through local network LAN to a host computer HC. This can include data communication services provided through the worldwide packet data communication network, now commonly referred to as the "Internet" INT. Local network LAN (Internet) both use electrical, electromagnetic or optical signals that carry digital data streams. The signals through the various networks and the signals on network data link NDL and through communication interface CI, which carry the digital data to and from computer system CS, are exemplary forms of carrier waves transporting the information.

Computer system CS can send messages and receive data, including program code, through the network(s), network data link NDL, and communication interface CI. In the Internet example, host computer HC might transmit a requested code for an application program through Internet INT, network data link NDL, local network LAN and communication interface CI. One such downloaded application may provide all or part of a method described herein, for example. The received code may be executed by processor PRO as it is received, and/or stored in storage device SD, or other non-volatile storage for later execution. In this manner, computer system CS may obtain application code in the form of a carrier wave.

Figure 15:
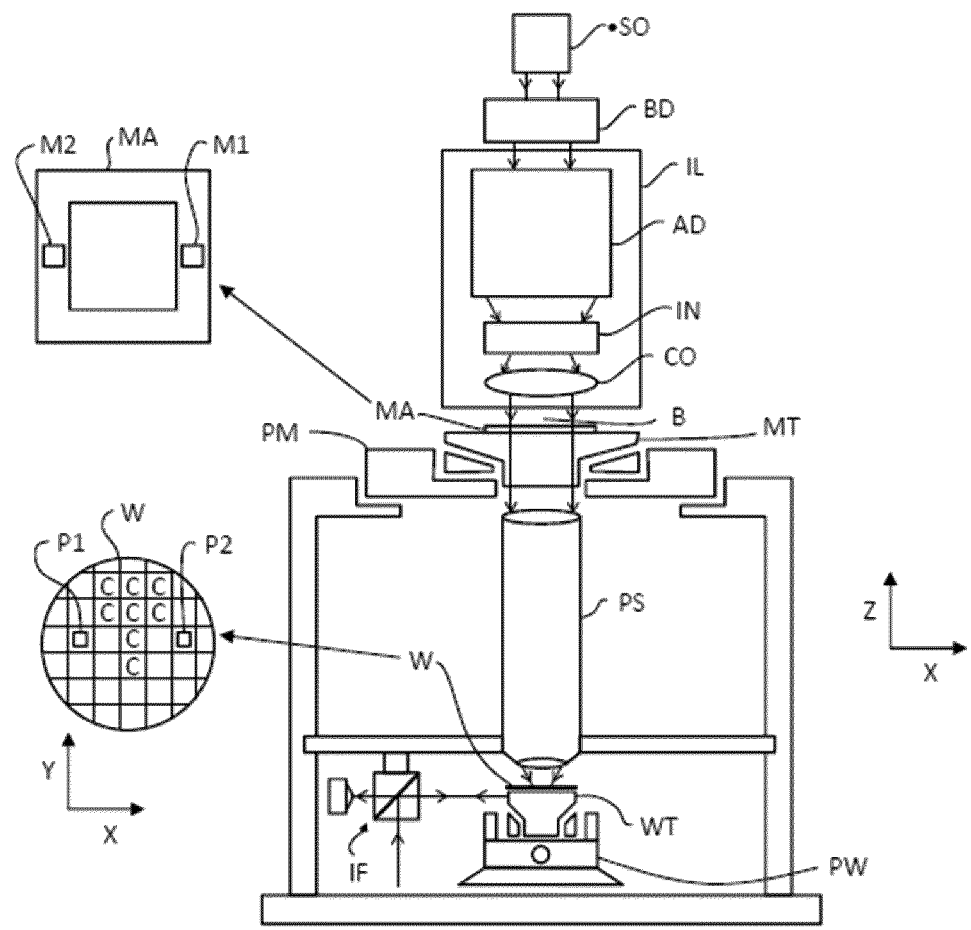
FIG. 15 is a schematic diagram of a lithographic projection apparatus, according to an embodiment.

FIG. 15 is a schematic diagram of a lithographic projection apparatus, according to an embodiment.

The lithographic projection apparatus can include an illumination system IL, a first object table MT, a second object table WT, and a projection system PS.

Illumination system IL, can condition a beam B of radiation. In this particular case, the illumination system also comprises a radiation source SO.

First object table (e.g., patterning device table) MT can be provided with a patterning device holder to hold a patterning device MA (e.g., a reticle), and connected to a first positioner to accurately position the patterning device with respect to item PS.

Second object table (substrate table) WT can be provided with a substrate holder to hold a substrate W (e.g., a resist-coated silicon wafer), and connected to a second positioner to accurately position the substrate with respect to item PS.

Projection system ("lens") PS (e.g., a refractive, catoptric or catadioptric optical system) can image an irradiated portion of the patterning device MA onto a target portion C (e.g., comprising one or more dies) of the substrate W.

As depicted herein, the apparatus can be of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning apparatuses, such as a beam expander Ex, for example. The illuminator IL may comprise adjusting device AD for setting the outer and/or inner radial extent (commonly referred to as σ-outer and σ-inner, respectively) of the amplitude distribution in the beam. In addition, it will generally comprise various other components, such as an integrator IN and a condenser CO. In this way, the beam B impinging on the patterning device MA has a desired uniformity and amplitude distribution in its cross-section.

In some embodiments, source SO may be within the housing of the lithographic projection apparatus (as is often the case when source SO is a mercury lamp, for example), but that it may also be remote from the lithographic projection apparatus, the radiation beam that it produces being led into the apparatus (e.g., with the aid of suitable directing mirrors); this latter scenario can be the case when source SO is an excimer laser (e.g., based on KrF, ArF or F2 lasing).

The beam PB can subsequently intercept patterning device MA, which is held on a patterning device table MT. Having traversed patterning device MA, the beam B can pass through the lens PL, which focuses beam B onto target portion C of substrate W. With the aid of the second positioning apparatus (and interferometric measuring apparatus IF), the substrate table WT can be moved accurately, e.g. so as to position different target portions C in the path of beam PB. Similarly, the first positioning apparatus can be used to accurately position patterning device MA with respect to the path of beam B, e.g., after mechanical retrieval of the patterning device MA from a patterning device library, or during a scan. In general, movement of the object tables MT, WT can be realized with the aid of a long-stroke module (coarse positioning) and a short-stroke module (fine positioning). However, in the case of a stepper (as opposed to a step-and-scan tool) patterning device table MT may just be connected to a short stroke actuator, or may be fixed.

The depicted tool can be used in two different modes, step mode and scan mode. In step mode, patterning device table MT is kept essentially stationary, and an entire patterning device image is projected in one go (i.e., a single "flash") onto a target portion C. Substrate table WT can be shifted in the x and/or y directions so that a different target portion C can be irradiated by beam PB.

In scan mode, essentially the same scenario applies, except that a given target portion C is not exposed in a single "flash." Instead, patterning device table MT is movable in a given direction (the so-called "scan direction", e.g., the y direction) with a speed v, so that projection beam B is caused to scan over a patterning device image; concurrently, substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 16:
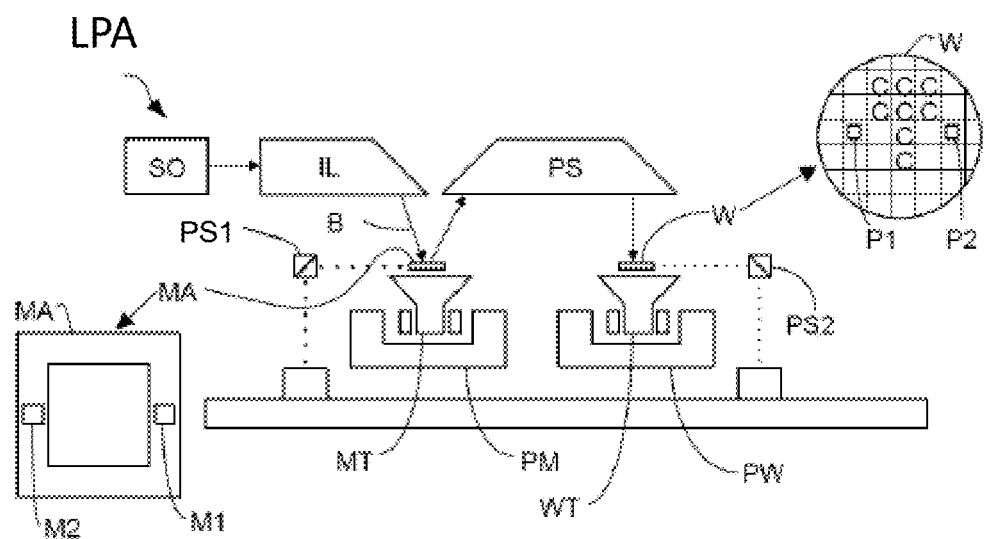
FIG. 16 is a schematic diagram of another lithographic projection apparatus, according to an embodiment.

FIG. 16 is a schematic diagram of another lithographic projection apparatus (LPA), according to an embodiment.

LPA can include source collector module SO, illumination system (illuminator) IL configured to condition a radiation beam B (e.g. EUV radiation), support structure MT, substrate table WT, and projection system PS.

Support structure (e.g. a patterning device table) MT can be constructed to support a patterning device (e.g. a mask or a reticle) MA and connected to a first positioner PM configured to accurately position the patterning device;

Substrate table (e.g. a wafer table) WT can be constructed to hold a substrate (e.g. a resist coated wafer) W and connected to a second positioner PW configured to accurately position the substrate.

Projection system (e.g. a reflective projection system) PS can be configured to project a pattern imparted to the radiation beam B by patterning device MA onto a target portion C (e.g. comprising one or more dies) of the substrate W.

As here depicted, LPA can be of a reflective type (e.g. employing a reflective patterning device). It is to be noted that because most materials are absorptive within the EUV wavelength range, the patterning device may have multilayer reflectors comprising, for example, a multi-stack of molybdenum and silicon. In one example, the multi-stack reflector has a 40 layer pairs of molybdenum and silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Illuminator IL can receive an extreme ultra violet radiation beam from source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. Source collector module SO may be part of an EUV radiation system including a laser for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser may not be considered to form part of the lithographic apparatus and the radiation beam can be passed from the laser to the source collector module with the aid of a beam delivery system comprising, for example, suitable directing mirrors and/or a beam expander. In other cases, the source may be an integral part of the source collector module, for example when the source is a discharge produced plasma EUV generator, often termed as a DPP source.

Illuminator IL may comprise an adjuster for adjusting the angular amplitude distribution of the radiation beam. Generally, at least the outer and/or inner radial extent (commonly referred to as σ-outer and σ-inner, respectively) of the amplitude distribution in a pupil plane of the illuminator can be adjusted. In addition, the illuminator IL may comprise various other components, such as facetted field and pupil mirror devices. The illuminator may be used to condition the radiation beam, to have a desired uniformity and amplitude distribution in its cross section.

The radiation beam B can be incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LPA could be used in at least one of the following modes, step mode, scan mode, and stationary mode.

In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

In scan mode, the support structure (e.g. patterning device table) MT and the substrate table WT are scanned synchronously while a pattern imparted to the radiation beam is projected onto target portion C (i.e. a single dynamic exposure). The velocity and direction of substrate table WT relative to the support structure (e.g. patterning device table) MT may be determined by the (de-) magnification and image reversal characteristics of the projection system PS.

In stationary mode, the support structure (e.g. patterning device table) MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 17:
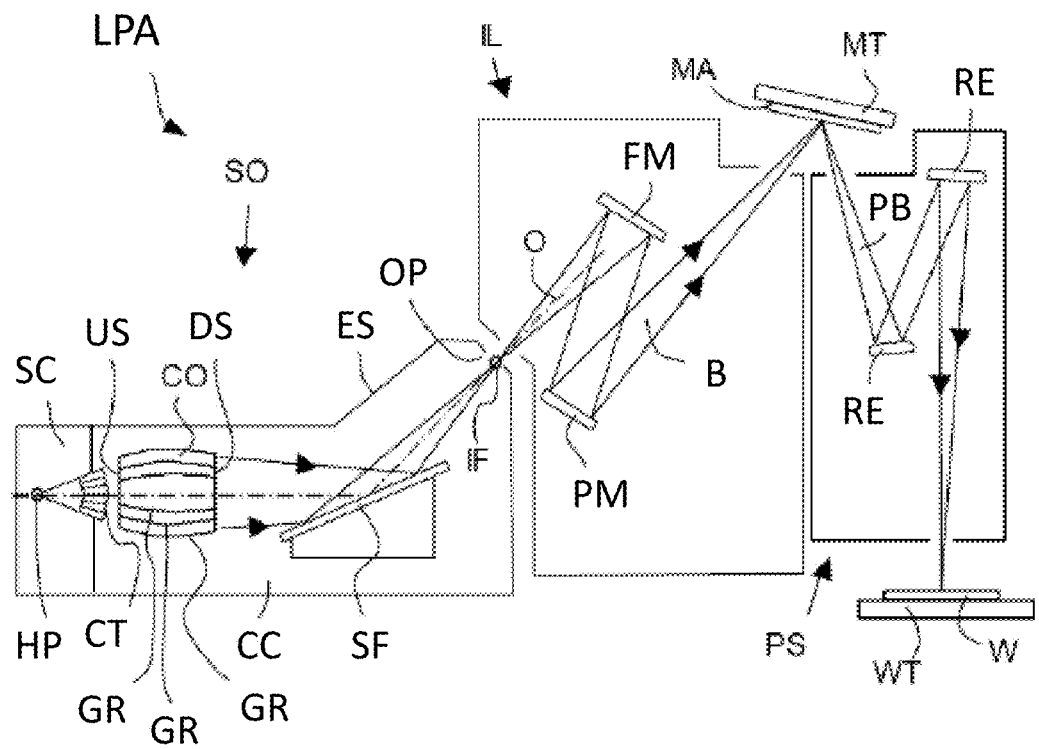
FIG. 17 is a detailed view of the lithographic projection apparatus, according to an embodiment.

FIG. 17 is a detailed view of the lithographic projection apparatus, according to an embodiment.

As shown, LPA can include the source collector module SO, the illumination system IL, and the projection system PS. The source collector module SO is constructed and arranged such that a vacuum environment can be maintained in an enclosing structure ES of the source collector module SO. An EUV radiation emitting hot plasma HP may be formed by a discharge produced plasma source. EUV radiation may be produced by a gas or vapor, for example Xe gas, Li vapor or Sn vapor in which the hot plasma HP is created to emit radiation in the EUV range of the electromagnetic spectrum. The hot plasma HP is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma HP is passed from a source chamber SC into a collector chamber CC via an optional gas barrier or contaminant trap CT (in some cases also referred to as contaminant barrier or foil trap) which is positioned in or behind an opening in source chamber SC. The contaminant trap CT may include a channel structure. Contamination trap CT may also include a gas barrier or a combination of a gas barrier and a channel structure. The contaminant trap or contaminant barrier CT further indicated herein at least includes a channel structure, as known in the art.

The collector chamber CC may include a radiation collector CO which may be a so-called grazing incidence collector. Radiation collector CO has an upstream radiation collector side US and a downstream radiation collector side DS. Radiation that traverses radiation collector CO can be reflected off a grating spectral filter SF to be focused in a virtual source point IF along the optical axis indicated by the dot-dashed line 'O'. The virtual source point IF can be referred to as the intermediate focus, and the source collector module can be arranged such that the intermediate focus IF is located at or near an opening OP in the enclosing structure ES. The virtual source point IF is an image of the radiation emitting plasma HP.

Subsequently the radiation traverses the illumination system IL, which may include a facetted field mirror device FM and a facetted pupil mirror device pm arranged to provide a desired angular distribution of the radiation beam B, at the patterning device MA, as well as a desired uniformity of radiation amplitude at the patterning device MA. Upon reflection of the beam of radiation B at the patterning device MA, held by the support structure MT, a patterned beam PB is formed and the patterned beam PB is imaged by the projection system PS via reflective elements RE onto a substrate W held by the substrate table WT.

More elements than shown may generally be present in illumination optics unit IL and projection system PS. The grating spectral filter SF may optionally be present, depending upon the type of lithographic apparatus. Further, there may be more mirrors present than those shown in the figures, for example there may be 1-6 additional reflective elements present in the projection system PS.

Collector optic CO can be a nested collector with grazing incidence reflectors GR, just as an example of a collector (or collector mirror). The grazing incidence reflectors GR are disposed axially symmetric around the optical axis O and a collector optic CO of this type may be used in combination with a discharge produced plasma source, often called a DPP source.

Figure 18:
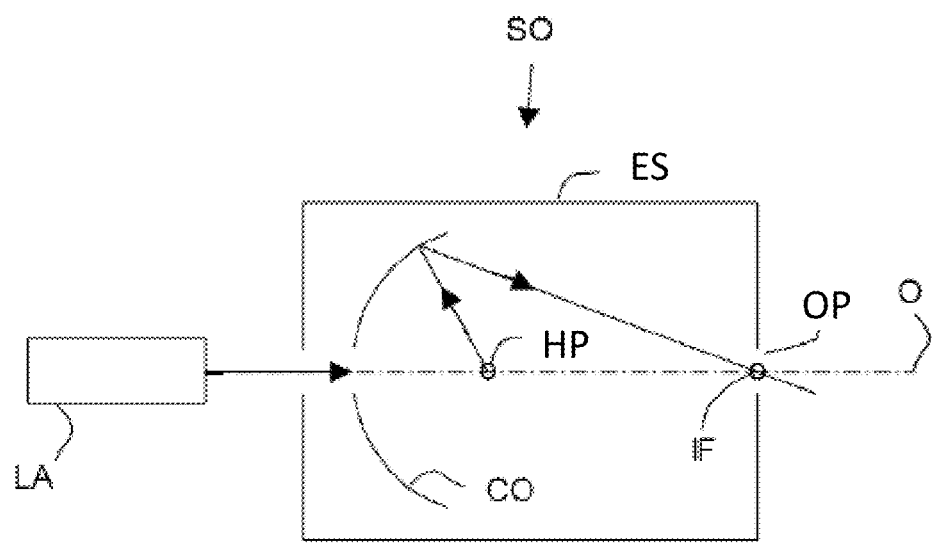
FIG. 18 is a detailed view of the source collector module of the lithographic projection apparatus, according to an embodiment.

FIG. 18 is a detailed view of source collector module SO of lithographic projection apparatus LPA, according to an embodiment.

Source collector module SO may be part of an LPA radiation system. A laser LA can be arranged to deposit laser energy into a fuel, such as xenon (Xe), tin (Sn) or lithium (Li), creating the highly ionized plasma HP with electron temperatures of several 10's of eV. The energetic radiation generated during de-excitation and recombination of these ions is emitted from the plasma, collected by a near normal incidence collector optic CO and focused onto the opening OP in the enclosing structure ES.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-50 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

Further embodiments are disclosed in the subsequent list of numbered clauses:

1. A method of use for a lithographic tool, the method comprising: scanning a substrate relative to a first micro-lens array (MLA) and a second MLA each having a plurality of rows of lenslets, wherein the first MLA has functional lenslets and extra lenslets, wherein the scanning comprises delivering light through the lenslets of the first MLA and second MLA to the substrate, the delivering including: delivering light through the functional lenslets to form a pattern on the substrate, the pattern having gaps caused by a positional or rotational misalignment between the functional lenslets of the first MLA and the second MLA, and delivering light through the extra lenslets to fill the gaps in the pattern.
2. The method of any of the previous clauses, wherein a positional misalignment of the first MLA and the second MLA in excess of a tolerance causes the gaps.
3. The method of any of the previous clauses, wherein the extra lenslets are in an extra row of the first MLA.
4. The method of any of the previous clauses, further comprising increasing a number of extra rows of the extra lenslets to increase the tolerances proportionally.
5. The method of any of the previous clauses, further comprising dedicating three extra rows of the MLA to filling the gaps, thereby increasing the tolerance from 10-500 nm to 1-10 um.

6. The method of any of the previous clauses, further comprising performing the scanning at a second scan angle that is reduced from a first scan angle due to the utilization of the extra lenslets for filling the gaps.
7. The method of any of the previous clauses, further comprising delivering the light to a stitching region located where a first scan pattern of the first MLA and a second scan pattern of the second MLA overlap.
8. The method of any of the previous clauses, further comprising delivering light to an end gap located in an area of the pattern where a first scan pattern of the first MLA and a second scan pattern of the second MLA do not overlap.
9. The method of any of the previous clauses, further comprising overscanning during the delivery of the light by continuing the scanning of the substrate in a scan direction to fill the gaps in the pattern, thereby further increasing the tolerance in the scan direction.
10. The method of any of the previous clauses, wherein the gaps are at least partially caused by a positional misalignment of the first MLA and the second MLA, and the scanning is performed within a positional tolerance for the positional misalignment increased by the utilization of the extra lenslets.
11. The method of any of the previous clauses, wherein the gaps are at least partially caused by a rotational misalignment of the first MLA and the second MLA, and the scanning is performed within a rotational tolerance for the rotational misalignment increased by the utilization of the extra lenslets.
12. The method of any of the previous clauses, further comprising scanning the substrate with a tolerance being a combination of a positional tolerance and a rotational tolerance, wherein the scanning is performed within both the positional tolerance and the rotational tolerance that are both increased by utilization of the extra lenslets.
13. The method of any of the previous clauses, wherein approximately half of the increase in the tolerance is applied to increasing the positional tolerance and approximately half of the increase tolerance is applied to increasing the rotational tolerance.
14. A computer program product comprising a non-transitory computer readable medium having instructions recorded thereon, the instructions when executed by a computer implementing the method of any of the previous clauses.
15. A lithography system comprising: a lithographic tool comprising a first micro-lens array (MLA) and a second MLA each having a plurality of rows of lenslets, wherein the first MLA has functional lenslets and extra lenslets; wherein the functional lenslets are configured to receive light therethrough to form a pattern on a substrate, the pattern having gaps caused by a positional or rotational misalignment between the functional lenslets of the first MLA and the second MLA, and wherein the extra lenslets are configured to receive light therethrough for filling the gaps in the pattern; and a control system that controls a scanning of the substrate with the light passing through functional lenslets and the extra lenslets.
16. The lithography system of any of the previous clauses, wherein the first MLA and second MLA are at a second scan angle relative to the substrate that is reduced from a first scan angle, wherein the second scan angle is due to the utilization of the extra lenslets for filling the gaps.
17. The lithography system of any of the previous clauses, wherein the first MLA and the second MLA are oriented at a scan angle relative to the substrate to have a positional tolerance that is increased due to the utilization of the extra lenslets.
18. The lithography system of any of the previous clauses, wherein the first MLA and the second MLA are oriented at a scan angle relative to the substrate to have a rotational tolerance that is increased due to the utilization of the extra lenslets.
19. The lithography system of any of the previous clauses, wherein the first MLA and the second MLA are oriented at a scan angle relative to the substrate to have a positional tolerance and a rotational tolerance that are both increased due to the utilization of the extra lenslets.
20. The lithography system of any of the previous clauses, wherein the increase is divided approximately equally between the positional tolerance and the rotational tolerance.
21. The lithography system of any of the previous clauses, wherein the first MLA has 100 rows and three of the 100 rows include the extra lenslets that increase a tolerance from 10-500 nm to 1-10 um by filling the gaps.
22. The lithography system of any of the previous clauses, wherein the lithography system is configured to manufacture flat-panel displays.

The invention claimed is:

1. A method of use for a lithographic tool, the method comprising:
    scanning a substrate relative to a first micro-lens array (MLA) and a second MLA, wherein each of the first MLA and second MLA has a plurality of rows of lenslets, wherein the first MLA has functional lenslets and extra lenslets, and wherein the scanning comprises delivering light through the lenslets of the first MLA and second MLA to the substrate, the delivering including:
    delivering light through the functional lenslets to form a pattern on the substrate, the pattern having gaps caused by a positional or rotational misalignment between the functional lenslets of the first MLA and the second MLA, and
    delivering light through the extra lenslets to fill the gaps in the pattern.
2. The method of claim 1, wherein a positional misalignment between the first MLA and the second MLA in excess of a tolerance causes the gaps.
3. The method of claim 1, wherein the extra lenslets are in an extra row of the first MLA.
4. The method of claim 3, further comprising increasing a number of extra rows of the extra lenslets to increase a tolerance proportionally.
5. The method of claim 1, further comprising performing the scanning at a second scan angle between the first and/or second MLA and the substrate that is reduced from a first scan angle between the first and/or second MLAs and the substrate due to the utilization of the extra lenslets for filling the gaps.
6. The method of claim 1, further comprising delivering the light to a stitching region located where a first scan pattern of the first MLA and a second scan pattern of the second MLA overlap.
7. The method of claim 1, further comprising delivering light to an end gap located in an area of the pattern where a first scan pattern of the first MLA and a second scan pattern of the second MLA do not overlap.

8. The method of claim 1, further comprising overscanning during the delivery of the light by continuing the scanning of the substrate in a scan direction to fill the gaps in the pattern to increase a tolerance in the scan direction.

9. The method of claim 1, wherein the gaps are at least partially caused by a positional misalignment between the first MLA and the second MLA, and the scanning is performed within a positional tolerance for the positional misalignment increased by the utilization of the extra lenslets.

10. The method of claim 1, wherein the gaps are at least partially caused by a rotational misalignment between the first MLA and the second MLA, and the scanning is performed within a rotational tolerance for the rotational misalignment increased by the utilization of the extra lenslets.

11. The method of claim 1, further comprising scanning the substrate with a tolerance being a combination of a positional tolerance and a rotational tolerance, wherein the scanning is performed within both the positional tolerance and the rotational tolerance that are both increased by utilization of the extra lenslets.

12. A computer program product comprising a non-transitory computer readable medium having instructions recorded thereon or therein, the instructions when executed by a computer system configured to cause the computer system to cause implementation of at least the method of claim 1.

13. A lithography system comprising:
a lithographic tool comprising a first micro-lens array (MLA) and a second MLA each having a plurality of rows of lenslets, wherein the first MLA has functional lenslets and extra lenslets, wherein the functional lenslets are configured to receive light therethrough to form a pattern on a substrate; and
a control system configured to control a scanning of the substrate with the light passing through the functional lenslets and the extra lenslets and to have the extra lenslets receive light therethrough for filling gaps in the pattern, the gaps caused by a positional or rotational misalignment between the functional lenslets of the first MLA and the second MLA.

14. The lithography system of claim 13, wherein the control system is configured to perform the scanning at a second scan angle between the first and/or second MLA and the substrate that is reduced from a first scan angle between the first and/or second MLA and the substrate, wherein the second scan angle is due to the utilization of the extra lenslets for filling the gaps.

15. The lithography system of claim 13, wherein the control system is configured to perform the scanning at a scan angle between the first and/or second MLA and the substrate to have a positional tolerance that is increased due to the utilization of the extra lenslets.

16. The lithography system of claim 13, wherein the control system is configured to perform the scanning at a scan angle between the first and/or second MLA and the substrate to have a rotational tolerance that is increased due to the utilization of the extra lenslets.

17. The lithography system of claim 13, wherein the control system is configured to perform the scanning at a scan angle between the first and/or second MLA and the substrate to have a positional tolerance and a rotational tolerance that are both increased due to the utilization of the extra lenslets.

18. The lithography system of claim 17, wherein the increase is divided approximately equally between the positional tolerance and the rotational tolerance.

19. The lithography system of claim 13, wherein the first MLA has 100 rows and three of the 100 rows include the extra lenslets that increase a tolerance from 10-500 nm to 1-10 μm by filling the gaps.

20. The lithography system of claim 13, configured to manufacture flat-panel displays.

* * * * *

UNITED STATES PATENT AND TRADEMARK OFFICE
CERTIFICATE OF CORRECTION

| | | |
|---|---|---|
| PATENT NO. | : 12,461,449 B2 | Page 1 of 1 |
| APPLICATION NO. | : 18/577035 | |
| DATED | : November 4, 2025 | |
| INVENTOR(S) | : Jasper Winters et al. | |

It is certified that error appears in the above-identified patent and that said Letters Patent is hereby corrected as shown below:

On the Title Page

Item (72) should read:
-- Jasper Winters, Nieuw Vennep (NL);
Erwin John Van Zwet, Pijnacker (NL);
Marcus Johannes Van Der Lans, Hillegom (NL);
Pieter Willem Herman De Jager, Middelbeers (NL);
Emiel Anton Van De Ven, Eindhoven (NL) --

Signed and Sealed this
Thirteenth Day of January, 2026

John A. Squires
*Director of the United States Patent and Trademark Office*